US005666190A

United States Patent [19]
Quate et al.

[11] Patent Number: 5,666,190
[45] Date of Patent: Sep. 9, 1997

[54] METHOD OF PERFORMING LITHOGRAPHY USING CANTILEVER ARRAY

[75] Inventors: Calvin F. Quate, Stanford, Calif.; Stephen Charles Minne, Danville, Ill.

[73] Assignee: The Board of Trustees of the Leland Stanford, Jr. University, Stanford, Calif.

[21] Appl. No.: 566,621

[22] Filed: Dec. 4, 1995

Related U.S. Application Data

[63] Continuation of Ser. No. 296,340, Aug. 25, 1994, abandoned, and a continuation-in-part of Ser. No. 226,784, Apr. 12, 1994, Pat. No. 5,517,280.

[51] Int. Cl.⁶ .......................... G01P 15/125; H01J 37/00; G01B 5/28
[52] U.S. Cl. ..................... 355/71; 250/234; 396/457
[58] Field of Search ..................... 355/71; 354/227.1; 250/234

[56] References Cited

U.S. PATENT DOCUMENTS

| | | | |
|---|---|---|---|
| 4,479,831 | 10/1984 | Sandow et al. | 148/1.5 |
| 4,724,318 | 2/1988 | Binnig | 250/306 |
| 5,138,174 | 8/1992 | Tang | 250/492.3 |
| 5,209,117 | 5/1993 | Bennett | 73/517 R |
| 5,210,410 | 5/1993 | Barrett | 250/234 |
| 5,221,415 | 6/1993 | Albrecht et al. | 156/629 |
| 5,227,626 | 7/1993 | Okada et al. | 250/234 |
| 5,231,286 | 7/1993 | Kajimura et al. | 250/234 |
| 5,254,854 | 10/1993 | Betzig | 250/234 |
| 5,345,815 | 9/1994 | Albrecht et al. | 73/105 |
| 5,354,985 | 10/1994 | Quate | 250/234 |
| 5,406,832 | 4/1995 | Gamble et al. | 73/105 |
| 5,444,244 | 8/1995 | Kirk et al. | 250/306 |
| 5,537,863 | 7/1996 | Fujiu et al. | 73/105 |

FOREIGN PATENT DOCUMENTS

| | | | |
|---|---|---|---|
| 1504-485-A | 8/1989 | U.S.S.R. | G01B 5/28 |
| WO 94/29894 | 12/1994 | WIPO | H01J 37/00 |

OTHER PUBLICATIONS

N. Barniol et al., "Modification of HF–Treated Silicon (100) Surfaces by Scanning Tunneling Microscopy in Air Under Imaging Conditions", Appl. Phys. Lett., vol. 61, No. 4, 27 Jul. 1992, 1992 American Institute of Physics, pp. 462–464.

J.A. Dagata et al., "Modification of Hydrogen–Passivated Silicon by a Scanning Tunneling Microscope Operating in Air", Appl. Phys. Lett., vol. 56, No. 20, 14 May 1990, pp. 2001–2003.

J.A. Dagata et al., "Pattern Generation on Semiconductor Surfaces by a Scanning Tunneling Microscope Operating in Air"J. Vac. Sci. Technol. B, vol. 9, No. 2, Mar/Apr 1991, pp. 1384–1388.

(List continued on next page.)

*Primary Examiner*—Michael L. Gellner
*Assistant Examiner*—Daniel P. Malley
*Attorney, Agent, or Firm*—Skjerven, Morrill, MacPherson, Franklin & Friel; David E. Steuber

[57] ABSTRACT

A lithography system includes a plurality of cantilevers, preferably formed in a silicon wafer. Each cantilever includes a tip located near the free end of the cantilever and an electrical conduction path which extends along the length of the cantilever to the tip. A switch is included in the conduction path to control the voltage at the tip of the cantilever.

The array of such cantilevers is positioned adjacent a wafer which is to be patterned, in the manner of an atomic force microscope operating in either the contact or noncontact mode. The cantilever array is scanned over the wafer, preferably in a raster pattern, and the individual switches are operated so as to control an electric current or electric field at the tip of each cantilever. The electric current or field is used to write a pattern on a layer of resist coating the wafer or on the surface of the wafer itself. Alternatively, the lithographic pattern may be formed by using the tip to scribe lines in a thin layer of soft material coating the wafer.

32 Claims, 25 Drawing Sheets

OTHER PUBLICATIONS

Sugimura, et al., "Masking Patterning of Silicon Surface Based on Scanning Tunneling Microscope Tip–Induced Anodization and Chemical Etching", Appl. Phys. Lett., vol. 65, No. 12, 19 Sep. 1994, pp. 1569–1571.

Wang et al., "Nanometer–Structure Writing on SI(100) Surfaces Using a Non–Contact–Mode Atomic Force Microscope", Appl. Phys. Lett., vol. 65, No. 11, 12 Sep. 1994, pp. 1415–1417.

Wolf et al., "Silicon Processing for the VLSI ERA vol. 1: Process Technology", Lattice Press, 1986, pp. 209–210.

"Integrated optics and new wave phenomena in optical waveguides", P.K. Tien, Reviews of Modern Physics, vol. 49, No. 2, Apr. 1977, pp. 361–362.

"Integrated Acoustooptic Circuits and Applications", Chen S. Tsai, IEEE Transactions on Ultrasonics, Ferroelectrics and Frequency Control, vol. 39 No. 5, Sep. 1992, pp. 529–554.

"Guided–Wave Acousto–Optics Interactions, Devices and Applications", Chen S. Tsai (Ed.), Springer–Verlag, 1990, pp. 79 and 250–256.

"Near–field subwavelength micropattern generation: Pipette guided argon fluoride excimer laser microfabrication", M. Rudman et al., J. Appl. Phys. 72(9), 1 Nov. 1992, pp. 4379–4383.

"Optical characteristics of 0.1μm circular apertures in a metal film as light sources for scanning ultramicroscopy", U.Ch. Fischer, J. Vac. Sci. Technol. B 3(1), Jan/Feb 1985, pp. 386–390.

"Near–field optical microscope using a silicon–nitride probe", N.F. van Hulst et al., Appl. Phys. Lett. 62(5), 1 Feb. 1993, pp. 461–463.

"Near–field optical scanning microscopy in reflection", U.Ch. Fischer, Appl. Phys. Lett. 52(4), 25 Jan. 1988, pp. 249–251.

"Micron–Size Optical Waveguide for Optoelectronic Integrated Circuits", T. Nagata et al., Extended Abstracts of the 1993 International Conference on Solid State Devices and Materials, Makuhari, 1993, pp. 1047–1049.

"A Light Source Smaller Than the Optical Wavelength", K. Lieberman et al., Science, vol. 247, 5 Jan. 1990, pp. 59–61.

"Near–field differential scanning optical microscope with atomic force regulation", R. Toledo–Crow et al., Appl. Phys. Lett. 60(24), 15 Jun. 1992, pp. 2957–2959.

"Near–Field Optics: Microscopy, Spectroscopy, and Surface Modification Beyond the Diffraction Limit", Eric Betzig et al., Science vol. 257, 10 Jul. 1992, pp. 189–195.

"Breaking the Diffraction Barrier: Optical Microscopy on a Nanometric Scale", E. Betzig et al., Science vol. 251, 22 Mar. 1991, pp. 1468–1470.

"Combined shear force and near–field scanning optical microscopy", E. Betzig et al., Appl phys. Lett. 60(20), 18 May 1992, pp. 2484–2486.

N. Barniol et al., "Modification of HF–Treated Silicon (100) Surfaces by Scanning Tunneling Microscopy in Air Under Imaging Conditions", Appl. Phys. Lett., vol. 61, No. 4, 27 Jul. 1992, 1992 American Institute of Physics, pp. 462–464.

J.A. Dagata et al., "Modification of Hydrogen–Passivated Silicon by a Scanning Tunneling Microscope Operating in Air", Appl. Phys. Lett., vol. 56, No. 20, 14 May 1990, pp. 2001–2003.

J.A. Dagata et al., "Pattern Generation on Semiconductor Surfaces by a Scanning Tunneling Microscope Operating in Air", J. Vac. Sci. Technol. B, vol. 9, No. 2, Mar/Apr 1991, pp. 1384–1388.

Wang et al., "Nanometer–Structure Writing on SI (100) Surfaces Using a Non–Contact–Mode Atomic Force Microscope", Appl. Phys. Lett., vol. 65, No. 11, 12 Sep. 1994, pp. 1415–1417.

Wolf et al., "Silicon Processing for the VLSI ERA vol. 1: Process Technology", Lattice Press, 1986, pp. 209–210.

"Thermomechanical writing with an atomic force microscope tip", H.J. Mamin et al., Appl. Phys. Lett. 61(8), 24 Aug. 1992, pp. 1003–1005.

"The atomic force microscope used as a powerful tool for machining surfaces", T.A. Jung et al., Elsevier Science Publishers, 1992, pp. 1446–1451.

"25 nm chromium oxide lines by scanning tunneling lithography in air", H.J. Song et al., 38th Int'l. Symp. on Electron, Ion and Photon Beams, New Orleans, LA, May 31–Jun. 3, 1994, pp. 16 pgs.

"Nanometer–scale lithography using the atomic force microscope", A. Majumdar et al., Appl. Phys. Lett. 61 (19), 9 Nov. 1992, pp. 2293–2295.

"Tip–induced anodization of titanium surfaces by scanning tunneling microscopy: A humidity effect on nanolithography", H. Sugimuar et al., Appl. Phys. Lett. 62(9), 30 Aug. 1993, pp. 1288–1290.

"Nanometer scale patterning of silicon (100) surfaces by an atomic force microscope operating in air", L. Tsau et al., Appl. Phys. Lett. 64(16), 18 Apr. 1994, pp. 2133–2135.

"Fabrication of Si nanostructures with an atomic force microscope", E.S. Snow et al., Appl. Phys. Lett. 64(15), 11 Apr. 1994, pp. 1932–1934.

"Lithographic patterning of self–assembled films", J.M. Calvert, J. Vac. Sci. Technol. B 11(6), Nov/Dec 1993, pp. 2155–2163.

"Self–assembled monolayer electron beam resist on GaAs", R.C. Tiberio et al., Appl. Phys. Lett. 62(5), 1 Feb. 1993, pp. 476–478.

"Low voltage electron beam lithography in self–assembled ultrathin films with the scanning tunneling microscope", C.R.K. Marrian et al, Appl. Phys. Lett. 64(3), 17 Jan. 1994, pp. 390–392.

"Scanning Probe Lithography. 1. Scanning Tunneling Microscope Induced Lithography of Self–Assembled n–Alkanethiol Monolayer Resists", C.B. Ross et al., American Chemical Society, Langmuir, vol. 9, No. 3, 1993, pp. 632–636.

"Modification of Silicon Surface Produced by Electric Field Enhanced Oxidation Through Native Oxide", Y. Ejiri et al., Extended Abstracts of 1993 Int'l. Conf. on Solid State Devices and Materials, 1993, pp. 606–608.

"Fabrication of silicon nanostructures with a scanning tunneling microscope", E.S. Snow et al., Appl. Phys. Lett. 63(6), 9 Aug. 1993, pp. 749–751.

"Nanometre–scale chemical modification using a scanning tunnelling microscope", Y. Utsugi, Nippon Telegraph and Telephone Corp., LSI Laboratories, undated, 2 pgs.

"Atomic Force Microscopy Using A Piezoresistive Cantilever", M. Tortonese et al., IEEE, Mar. 1991, pp. 448–450.

"Fabrication of Si nanostructures with an atomic force microscope", E.S. Snow et al., Appl. Phys. Lett. 64(15), 11 Apr. 1994, 12 pgs.

"Applications of Atomic Force Microscopy for Nanolithography", P.I. Oden et al., undated, 7 pgs.

*Technology of proximal probe lithography*, "Principles and Techniques of STM Lithography", M.A. McCord et al, 1993, The Society of Photo–Optical Instrumentation Engineers, pp. 16–32.

*Technology of proximal probe lithography*, "Low Voltage E–Beam Lithograph With The STM", C.R.K. Marrian et al, 1993, The Society of Photo–Optical Instrumentation Engineers, pp. 58–73.

*Technology of proximal probe lithography*, "The Technology of Proximal Probe Lithography: An Overview", J.A. Dagata et al, 1993, The Society of Photo–Optical Instrumentation Engineers, pp. 3–11.

"Nanometer Lithography on Silicon and Hydrogenated Amouphous Silicon with Low Energy Electrons", Kramer et al., abstract, International Conference on Micro and Nanofabrication, Sep. 1994.

N. Kramer et al., "Fabrication of Metallic Nanowires with a Scanning Tunneling Microscope", 1995 American Institute of Physics, Appl. Phys. Lett. 66 (11), 13 Mar. 1995, pp. 1325–1327.

"Silicon transfer layer for multilayer resist systems", J.B. Kruger et al., J.Vac. Sci. Technol., 19(4),.Nov/Dec 1981, pp. 1320–1324.

"Thermomechanical writing with an atomic force microscope tip", H.J. Mamin et al., Appl. Phys. Lett. 61(8), 24 Aug. 1992, pp. 1003–1005.

"The atomic force microscope used as a powerful tool for machining surfaces", T.A. Jung et al., Elsevier Science Publishers, 1992, pp. 1446–1451.

"25 nm chromium oxide lines by scanning tunneling lithography in air", H.J. Song et al., 38th Int'l. Symp. on Electron, Ion and Photon Beams, New Orleans, LA, May 31–Jun. 3, 1994, pp. 16 pgs.

"Nanometer–scale lithography using the atomic force microscope", A. Majumdar et al., Appl. Phys. Lett. 61(19), 9 Nov. 1992, pp. 2293–2295.

"Tip–induced anodization of titanium surfaces by scanning tunneling microscopy: A humidity effect on nanolithography", H. Sugimuar et al., Appl. Phys. Lett. 62(9), 30 Aug. 1993, pp. 1288–1290.

"Nanometer scale patterning of silicon (100) surfaces by an atomic force microscope operating in air", L. Tsau et al., Appl. Phys. Lett. 64(16), 18 Apr. 1994, pp. 2133–2135.

"Fabrication of Si nanostructures with an atomic force microscope", E.S. Snow et al., Appl. Phys. Lett. 64(15), 11 Apr. 1994, pp. 1932–1934.

"Lithographic patterning of self–assembled films", J.M. Calvert, J. Vac. Sci. Technol. B 11(6), Nov/Dec 1993, pp. 2155–2163.

"Self–assembled monolayer electron beam resist on GaAs", R.C. Tiberio et al., Appl. Phys. Lett. 62(5), 1 Feb. 1993, pp. 476–478.

"Low voltage electron beam lithography in self–assembled ultrathin films with the scanning tunneling microscope", C.R.K. Marrian et al, Appl. Phys. Lett. 64(3), 17 Jan. 1994, pp. 390–392.

"Scanning Probe Lithography. 1. Scanning Tunneling Microscope Induced Lithography of Self–Assembled n–Alkanethiol Monolayer Resists", C.B. Ross et al., American Chemical Society, Langmuir, vol. 9, No. 3, 1993, pp. 632–636.

"Modification of Silicon Surface Produced by Electric Field Enhanced Oxidation Through Native Oxide", Y. Ejiri et al., Extended Abstracts of 1993 Int'l. Conf. on Solid State Devices and Materials, 1993, pp. 606–608.

"Fabrication of silicon nanostructures with a scanning tunneling microscope", E.S. Snow et al., Appl. Phys. Lett. 63(6), 9 Aug. 1993, pp. 749–751.

"Nanometre–scale chemical modification using a scanning tunnelling microscope", Y. Utsugi, Nippon Telegraph and Telephone Corp., LSI Laboratories, undated, 2 pgs.

"Atomic Force Microscopy Using A Piezoresistive Cantilever", M. Tortonese et al., IEEE, Mar. 1991, pp. 448–450.

"Fabrication of Si nanostructures with an atomic force microscope", E.S. Snow et al., Appl. Phys. Lett. 64(15), 11 Apr. 1994, 12 pgs.

"Applications of Atomic Force Microscopy for Nanolithography", P.I. Oden et al., undated, 7 pgs.

*Technology of proximal probe lithography*, "Principles and Techniques of STM Lithography", M.A. McCord et al, 1993, The Society of Photo–Optical Instrumentation Engineers, pp. 16–32.

*Technology of proximal probe lithography*, "Low Voltage E–Beam Lithography With The STM", C.R.K. Marrian et al, 1993, The Society of Photo–Optical Instrumentation Engineers, pp. 58–73.

*Technology of proximal probe lithography*, "The Technology of Proximal Probe Lithography: An Overview", J.A. Dagata et al, 1993, The Society of Photo–Optical Instrumentation Engineers, pp. 3–11.

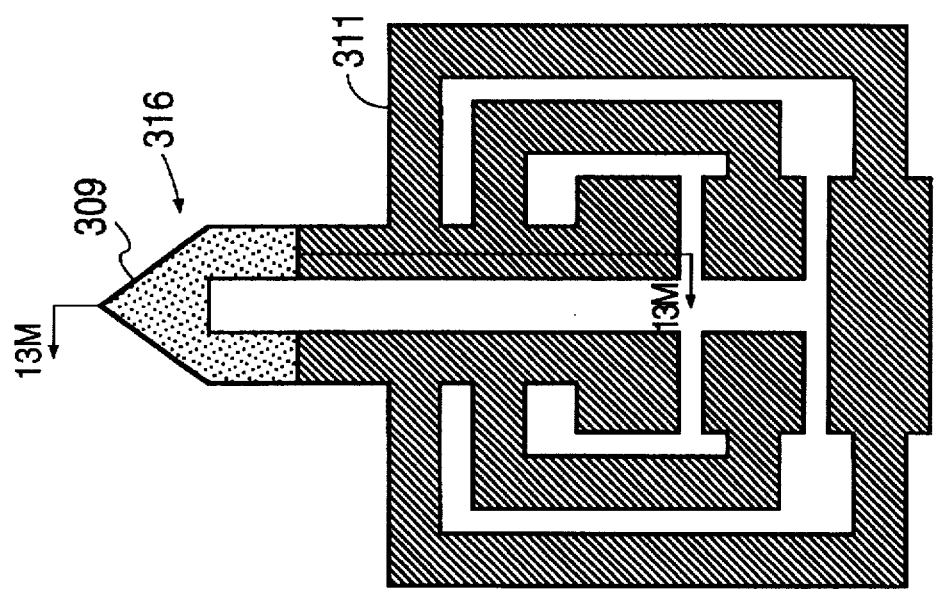
FIG. 13M1
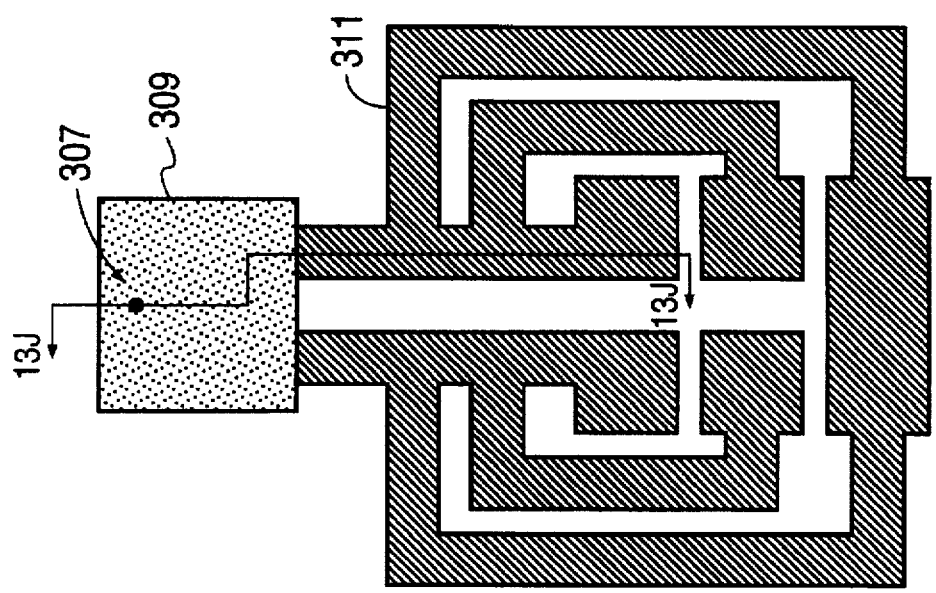
FIG. 13J1

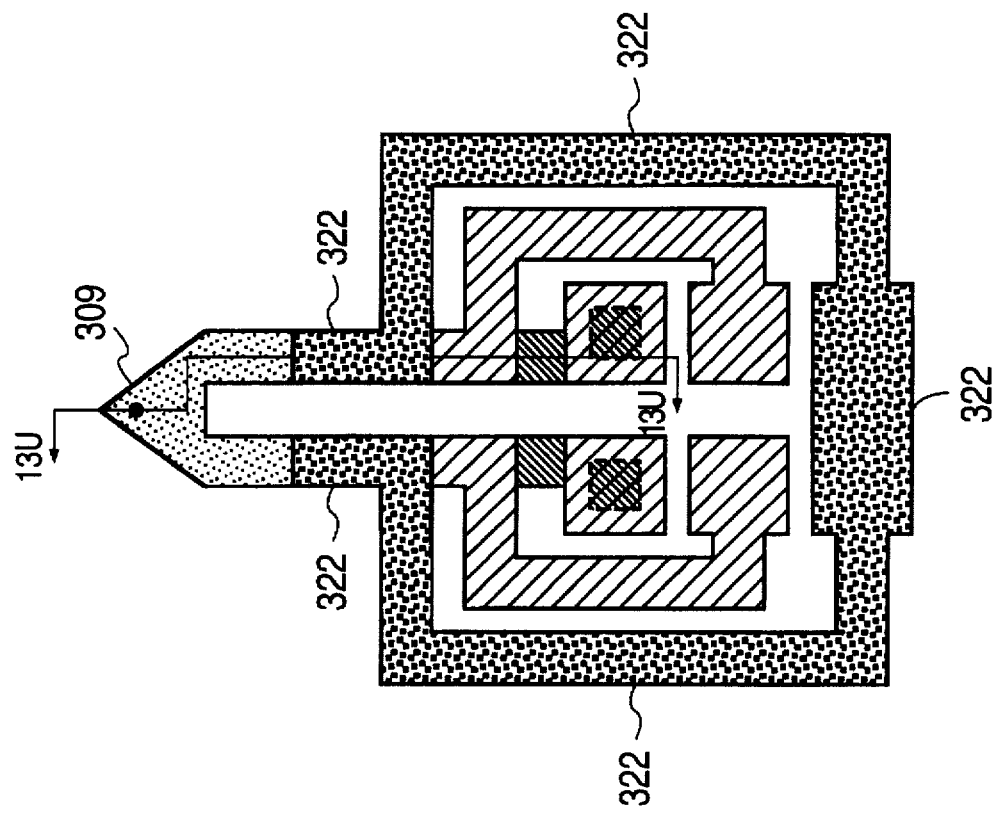
FIG. 13U1
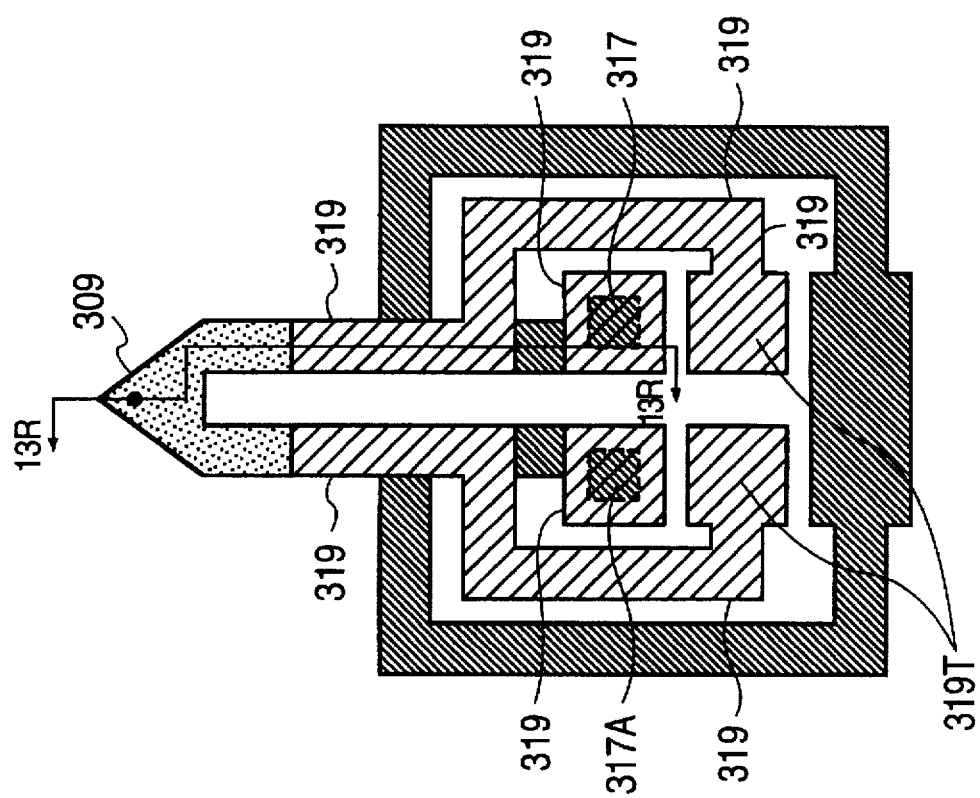
FIG. 13R1

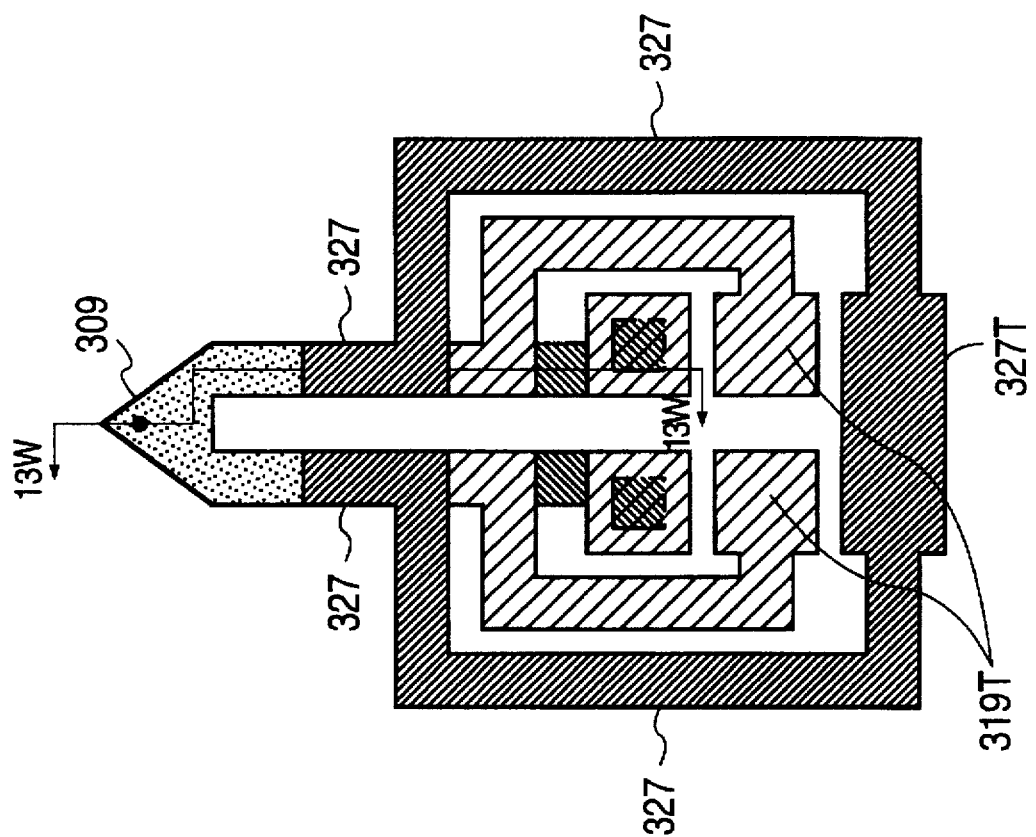
FIG. 13W1

METHOD OF PERFORMING LITHOGRAPHY USING CANTILEVER ARRAY

This application is a continuation of application Ser. No. 08/296,340, filed Aug. 25, 1994, now abandoned, and is a continuation-in-part of application Ser. No. 08/226,784, filed Apr. 12, 1994, now U.S. Pat. No. 5,517,280, issued May 14, 1996.

This invention was made with Government support under Contract No. N0014-91-J-1050, awarded by the Office of Naval Research. The Government has certain rights in this invention.

RELATED APPLICATION

This application is related to application Ser. No. 08/072,286, now U.S. Pat. No. 5,354,985, which is incorporated herein by reference in its entirety.

FIELD OF THE INVENTION

This invention relates to lithography technology and, in particular, to a lithography system which uses a plurality of cantilevers to produce a lithographic pattern containing extremely small features.

BACKGROUND OF THE INVENTION

In the technology of semiconductor fabrication it is well known to expose a layer of photoresist on a semiconductor wafer to a pattern of radiation, a process referred to as photolithography. The unexposed portions of the photoresist are removed by a developer solution, and the resulting photoresist pattern is used in processing the wafer. Usually the photoresist is exposed by directing the radiation through a photomask. Using ultraviolet light, these techniques can depict features having dimensions as small as approximately 0.2 or 0.3 µm. Photolithography systems which use x-ray technology can achieve higher resolution, but these systems are generally quite large and expensive.

Hence, there is a need for a lithography system that can produce extremely small features (as small as, say, 0.1 µm) and yet avoid the size and cost of x-ray systems. A system using an excimer laser beam guided through a hollow glass pipette is proposed in M. Rudman et al., "Near-field sub-wavelength micropattern generation: Pipette guided argon fluoride excimer laser microfabrication", J. Appl. Phys., Vol. 72, 1 November 1992, pp. 4379–4383, which is incorporated herein by reference.

SUMMARY OF THE INVENTION

The lithography system of this invention includes a plurality of cantilevers. Each cantilever includes a tip near its free end and a structure for directing and controlling a stream of electrons or electromagnetic energy to the tip.

In one embodiment, each cantilever includes a waveguide which guides electromagnetic energy to the tip. An aperture in the waveguide at the apex of the tip allows the electromagnetic energy to escape the waveguide. A switch is included in the waveguide so as to control the electromagnetic energy which reaches the tip and exits through the aperture. The electromagnetic energy is typically in the form of UV light, but other forms of radiation, such as visible light, may also be used in embodiments of this invention.

In the above embodiment, each cantilever functions in the manner of an atomic force microscope operating in the attractive mode. That is, the tip of the cantilever is brought very close to the surface of the photoresist and is vibrated at its resonant frequency. Since the tip of the cantilever is located extremely close to the photoresist surface, the resonant frequency of the cantilever is determined in part by Van der Waals forces or other forces which exist between the tip and the surface. In reality, it is the gradient of the forces that changes the resonant frequency. As the gap between the tip and the surface changes, these forces vary, and this variation in turn alters the resonant frequency of the cantilever.

The resonant frequency of the cantilever is detected, and a feedback system adjusts the distance between the tip and the surface so as to maintain the resonant frequency at a constant value. As a result, the gap between the photoresist surface and the tip of the cantilever is held constant. This gap must be controlled very precisely to ensure that only the desired area of the photoresist is exposed to the radiation. Alternatively, the amplitude of the oscillations of the cantilever can be detected, and this information can be used to control the gap between the photoresist surface and the tip of the cantilever.

The vibration of the cantilever is detected by means of a piezoresistor which is embedded in the cantilever in such a way that its resistance varies as the cantilever bends. The resistance of the piezoresistor is detected, and this provides a signal indicative of the resonant frequency of the cantilever. Using this information, the feedback system is used to control the gap between the tip and the surface of the photoresist.

Preferably, the cantilever is compound: it includes a "bending" portion which has a relatively high mechanical resonant frequency and a "vibrating" portion which has a lower mechanical resonant frequency. The cantilever is vibrated by means of a capacitive plate located adjacent the cantilever or by a piezoelectric material embedded within the cantilever. A superimposed AC and DC signal is applied to the capacitive plate. The AC component causes the cantilever to vibrate and the DC component regulates the neutral position of the cantilever relative to the surface of the photoresist.

The feedback loop contains the following elements. The piezoresistor is used to detect the vibrational frequency of the cantilever and delivers an output which is compared to a voltage level which represents the desired spacing between the tip and the photoresist surface. If the spacing, represented by the vibrational frequency of the cantilever, is not correct, an error signal is generated, and this error signal is delivered to circuitry which adjusts the DC component of the signal applied to the capacitive plate. This in turn produces a change in the spacing between the tip and the surface until the error signal is reduced to zero.

In the preferred embodiment, an array of cantilevers is formed in a wafer which is the same size as the wafer to be patterned. The latter is coated with resist, and both wafers contain dice which are congruent. The cantilevers are formed in one or more rows in each die of the lithographic wafer. The two wafers are brought face to face such that the tips of the cantilevers are extremely close to the surface of the photoresist. The wafer which is to be exposed is then scanned in a raster pattern in such a way that the cantilevers together cover the entire surface of the wafer. The switch in the waveguide for each cantilever is operated so as to expose individual pixels on the photoresist surface.

In an alternative embodiment, an electrical conduction path is substituted for the waveguide. The conduction path may be formed, for example, by coating the cantilever with a metal film or by doping the cantilever with positive or negative ions. A voltage is applied to the conduction path. In one variation, the surface to be patterned is covered with a thin layer of resist, a self-assembled monolayer (SAM) or a thicker multilayered surface imaging resist, which is exposed by electrons emerging from each tip in the cantilever array. In a second variation, an intense electrical field at the apex of each tip in the array is used in the presence of water vapor to oxidize, for example, a silicon surface or a layer of chromium or titanium. In a third variation, each tip is used to physically scribe a line in a layer of a soft material such as poly (methylmethacrylate) (PMMA).

In some embodiments it is not necessary to regulate the neutral positions of the cantilevers. To the extent that there are undulations in the surface of the substrate, the cantilevers are allowed to bend by varying degrees.

BRIEF DESCRIPTION OF THE DRAWINGS

The fabrication and operation of a photolithography system in accordance with this invention will become clearer by reference to the following drawings, in which.

DESCRIPTION OF THE INVENTION

This description will be divided into essentially five parts: First, the structure of an individual cantilever; second, the positioning of the cantilevers in a photolithographic wafer; third, the structure of the waveguides and other elements associated with the cantilevers; fourth, the circuitry and mechanisms for controlling the cantilevers; and fifth, the fabrication of the cantilevers and related components. Initially, the focus will be on cantilevers which use electromagnetic radiation to perform lithography; thereafter, cantilevers which perform lithography by electric current or fields or by physical pressure will be described.

Figure 1:
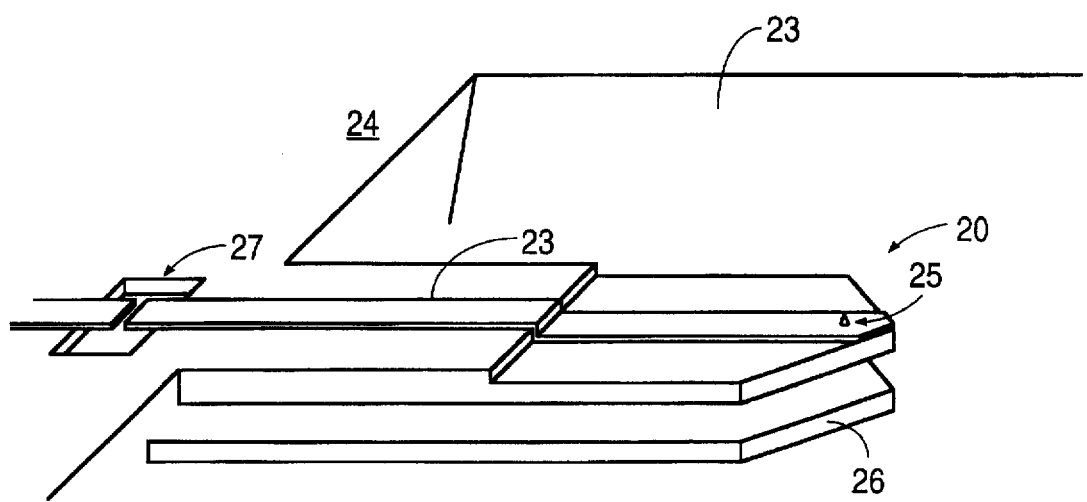
FIG. 1 illustrates a perspective view of a single compound cantilever and capacitive plate in accordance with the invention.
Figure 2A:
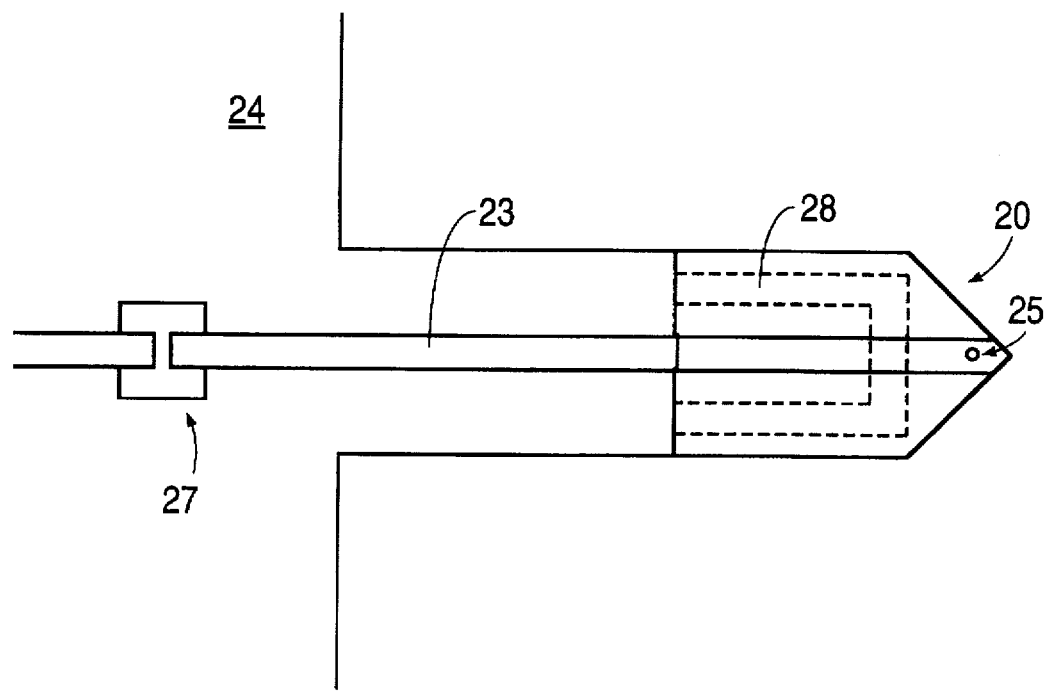
FIG. 2A illustrates a top plan view of the cantilever.
Figure 2B:
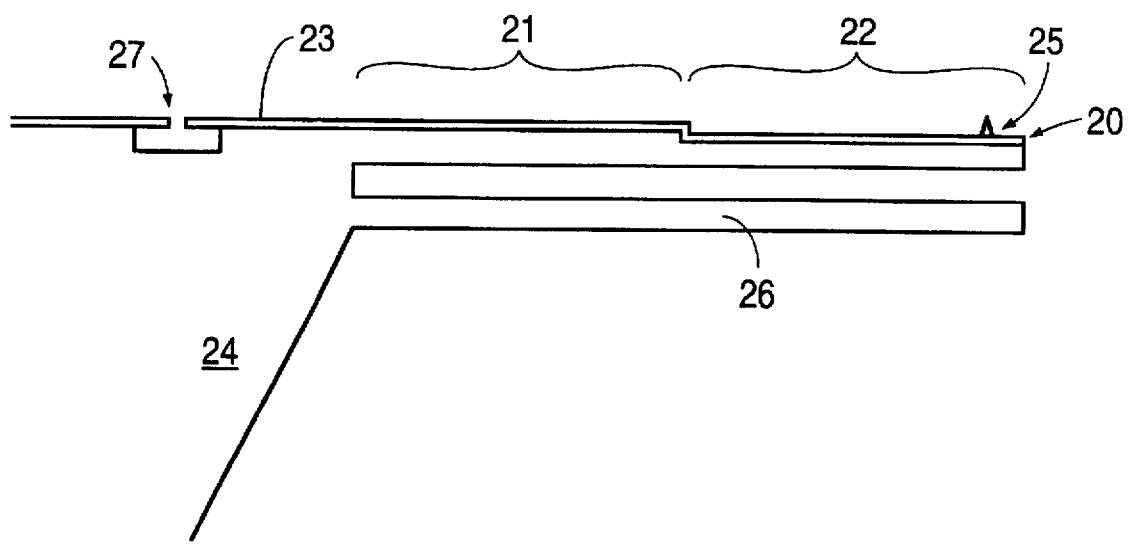
FIG. 2B illustrates a side elevational view of the cantilever and capacitive plate.

FIGS. 1, 2A and 2B illustrate the general structure of an individual photolithographic cantilever 20. As is evident particularly from FIG. 2B, each cantilever 20 includes a relatively thick "bending" section 21 and a relatively thin "vibrating" section 22. A waveguide 23 extends along the top surface of cantilever 20 and intersects a tip 25. (For ease of illustration, cantilever 20 is shown with tip 25 projecting upward. In normal operation, cantilever 20 would be oriented with tip 25 projecting downward.) A small aperture (not visible in FIGS. 1, 2A and 2B) allowing light to escape from waveguide 23 is located at the apex of tip 24. This light is used to expose a layer of photoresist. The diameter of the aperture determines the resolving power of the system when the diameter is less than one-half of the wavelength of the electromagnetic energy used.

Figure 3:
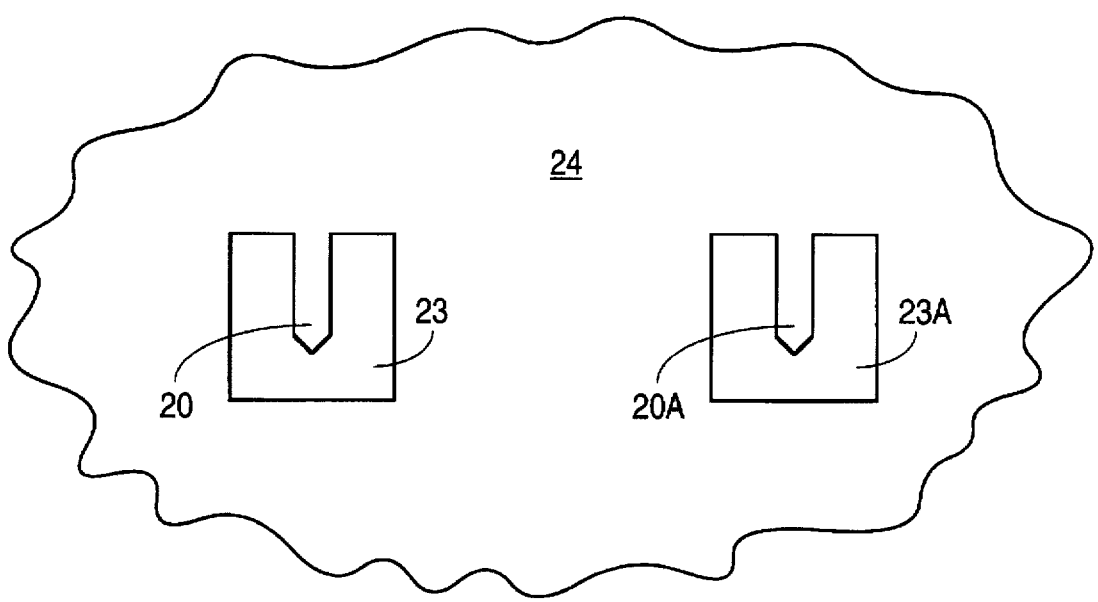
FIG. 3 illustrates two cantilevers formed side-by-side in a wafer.

Cantilever 20 projects into a window 23 which is formed in a wafer 24 (see FIG. 3). Also projecting into window 23 and adjacent to cantilever 20 is a capacitive plate 26. A light switch 27 controls the flow of light to tip 25. FIG. 2A shows a U-shaped piezoresistor 28 (dashed lines) which is formed within cantilever 20. As described below, the resistance of piezoresistor 28 varies as the "vibrating" section 22 of cantilever 20 is deflected.

Figure 4:
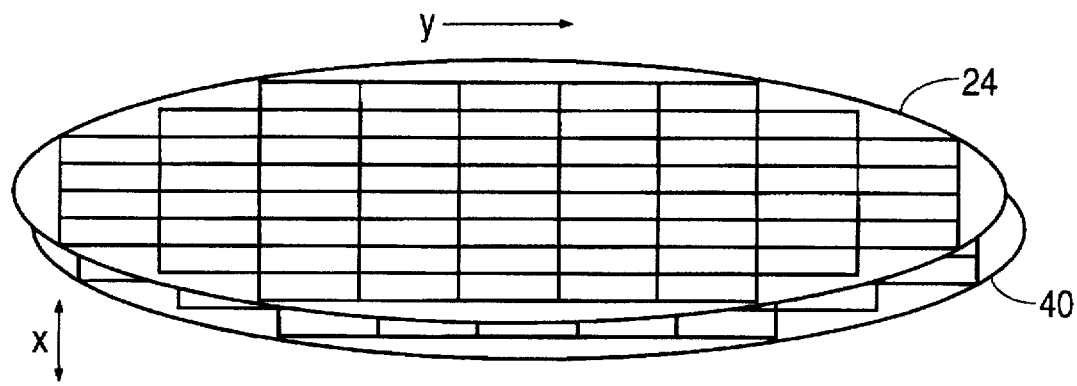
FIG. 4 illustrates the juxtaposition of a photolithographic wafer and a process wafer (i.e., a wafer to be patterned).
Figure 5:
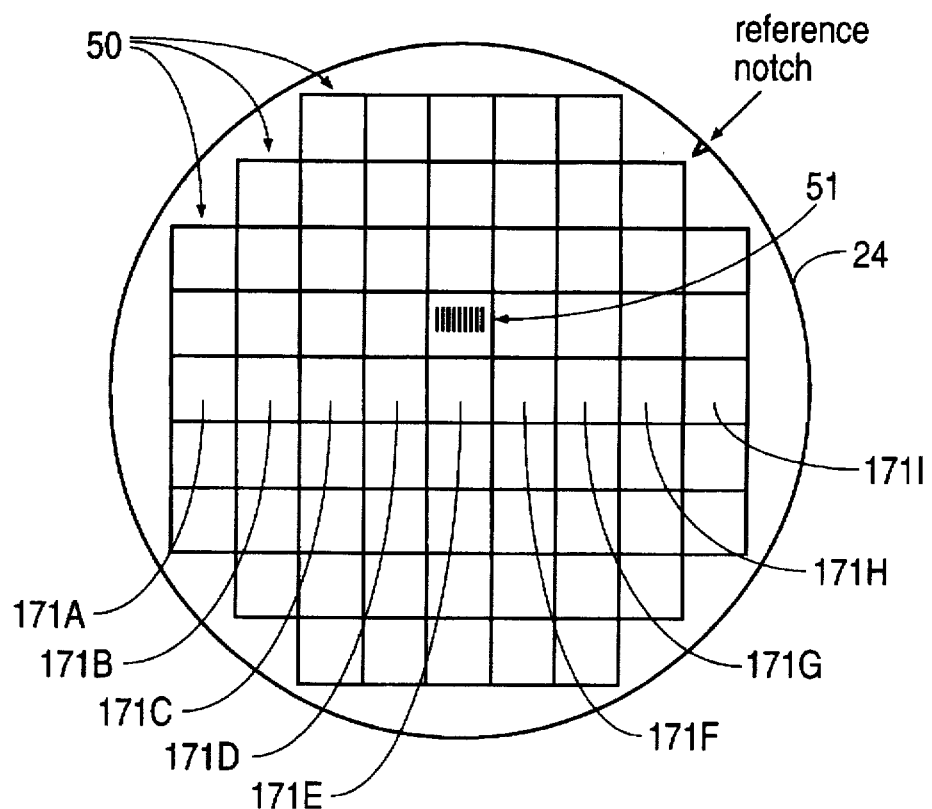
FIG. 5 illustrates the general distribution of the cantilevers on the photolithographic wafer.

FIG. 4 shows photolithographic wafer 24 juxtaposed above a process wafer 40. As indicated, wafers 24 and 40 can be moved with respect to each other in an x and a y direction. The top surface of process wafer 40 is typically coated with a layer of resist that is to be exposed FIG. 5 illustrates generally the distribution of cantilevers within wafer 24. Wafer 24 includes a plurality of dice 50, and a row of cantilevers 51 is arrayed in each of dice 50. FIG. 3 shows two cantilevers 20 and 20A positioned next to each other within windows 23 and 23A in wafer 24.

Figure 6A:
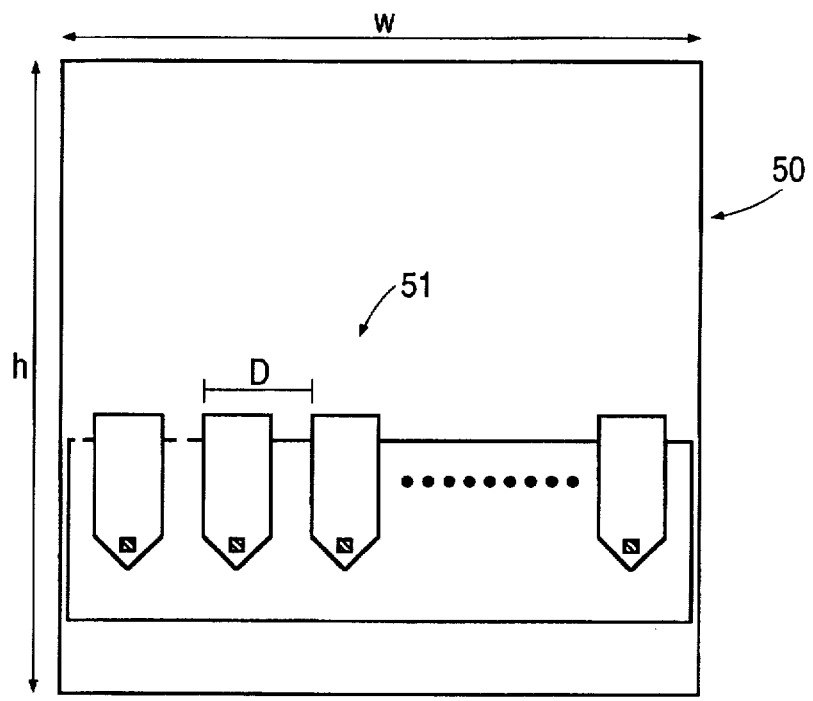
FIG. 6A illustrates the layout of a single row of cantilevers.
Figure 6B:
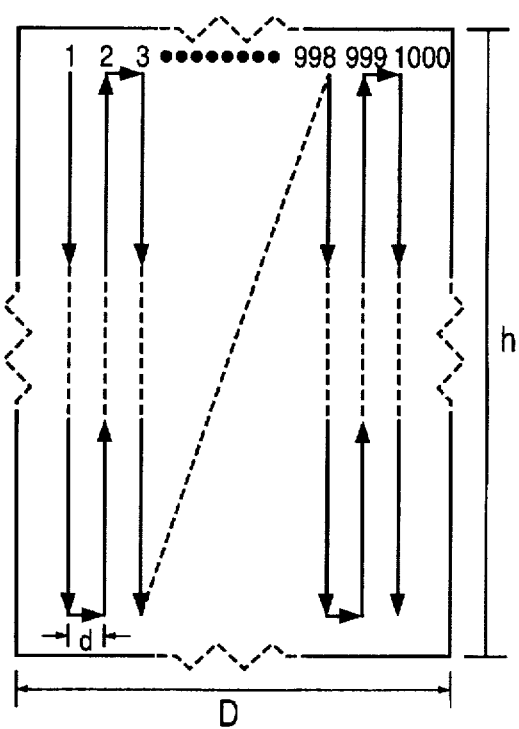
FIG. 6B illustrates the raster pattern scanned by an individual cantilever.

FIG. 6A illustrates schematically the orientation of cantilevers 51 within one of dice 50. In an illustrative embodiment, each of dice 50 may be in the shape of a square having a height h=2 cm and a width w=2 cm. There are 100 cantilevers 51 formed in a row across die 50. Accordingly, the cantilevers 51 are separated by a distance D=2 cm/100= 200 µm. As process wafer 40 is scanned, each of cantilevers 51 scans an area which measures 2 cm by 200 µm, as illustrated in FIG. 6B. If the illumination from the aperture at the end of tip 25 is 0.1 µm in diameter, for example, a series of parallel lines 0.1 µm in width will be formed as the cantilever is scanned. For complete coverage, the raster pattern illustrated in FIG. 6B is used, with each of the scanning lines being 2 cm in length and separated by a distance d=0.1 µm from the adjacent scanning line. Thus, to cover the entire 2 cm×200 µm area, a total of 2000 lines must be scanned by a single tip. Assuming that the scanning lines are in the y direction, wafers 24 and 40 are moved 0.1 µm in the x direction at the end of each scan. Since each scanning line is 2 cm in length, the tip will travel 4000 cm as it exposes the area shown in FIG. 6B. Each of the cantilevers formed in wafer 24 scans a similar area on wafer 40.

Assuming that wafer 40 is scanned in 200 seconds, the average scanning speed is 20 cm/sec. Since each tip traverses 4000 cm, it will expose 400 million 0.1 μm×0.1 μm pixels during the 200 second period. Thus, each pixel must be exposed in two microseconds, and the optical beam must be switched on or off for each pixel in two microseconds. In principle, the cantilever could be bent away from the surface of the resist to reduce the illumination and stop the exposure.

Figure 7A:
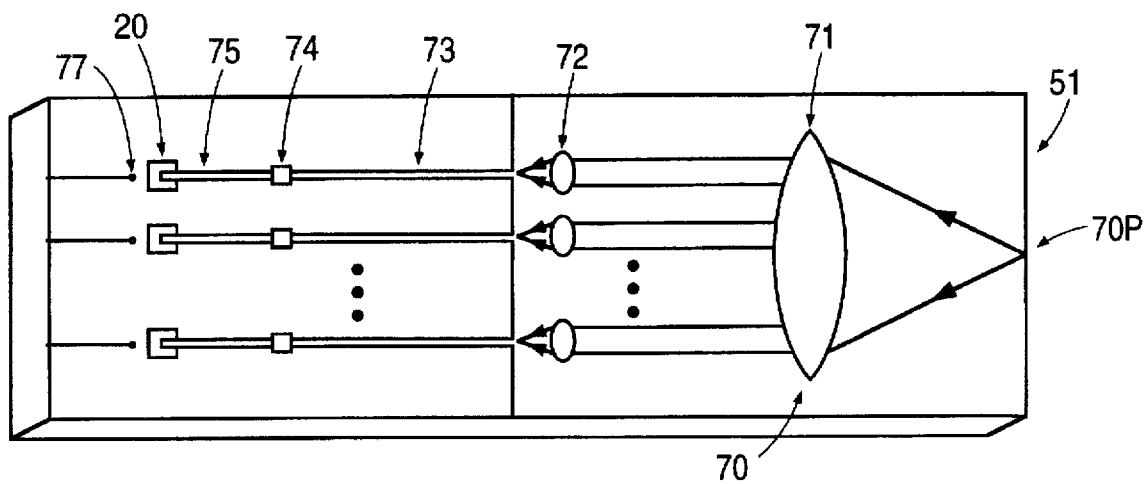
FIG. 7A illustrates schematically the waveguides and cantilevers on a single die.

FIG. 7A illustrates a general schematic view showing the cantilevers and waveguides in one of dice 50. The die includes a large planar waveguide 70. Formed in waveguide 70 are a large collimating lens 71 and a plurality of microlenses 72. Opposite each of microlenses 72 is a smaller waveguide 73 which leads to a light switch 74. From each light switch 74, a waveguide 75 directs the light to a cantilever 76. Opposite the end of each cantilever 76 is a photodiode 77 which detects when light is being directed through the tip of cantilever 76.

Lens 71 and microlenses 72 are preferably formed as thicker regions of planar waveguide 70. Since the velocity of light in a planar waveguide varies inversely with the thickness of the waveguide, lens 71 and microlenses 72 focus the light radiation as shown in FIG. 7A. Lenses of this kind are described in C. S. Tsai, "Integrated Acoustooptic Circuits and Applications", IEEE Transactions On Ultrasonics, Ferroelectrics, and Frequency Control, Vol. 39, No. 5, September 1992, pp. 529–554, which is incorporated herein by reference in its entirety. In addition, there are several alternative forms of lenses that could be used in place of the lenses shown in FIG. 7A, including lenses having a tapered thickness with parallel edges and diffraction grating lenses. These and other possible alternatives are described in *Guided-Wave Acousto-Optics*, C. S. Tsai (Ed.), Springer-Verlag (1990), pp. 79–82, 250–256, which is incorporated herein by reference.

Referring again to FIG. 4, the scanning pattern shown in FIG. 6B may preferably be generated by stepping photolithographic wafer 24 in 0.1 μm intervals in the y direction while process wafer 40 is moved back and forth in 2 cm segments in the x direction. Thus, process wafer 40 is moved 2 cm in one direction, photolithographic wafer is stepped 0.1 μm, process wafer 40 is moved 2 cm in the other direction, etc.

In this arrangement, light radiation can be introduced by means of a laser diode or another suitable laser or light source which is mounted in a fixed position relative to photolithographic wafer 24. In the example described above, one light beam would be directed to each of dice 50. As shown in FIG. 7A, the light beam enters planar waveguide 70 at a point 70P. The rays of light are made parallel by collimating lens 71 and are focused into waveguides 73 by microlenses 72. Light switches 74 control the passage of the light from waveguides 74 to each of cantilevers 76.

Figure 7B:
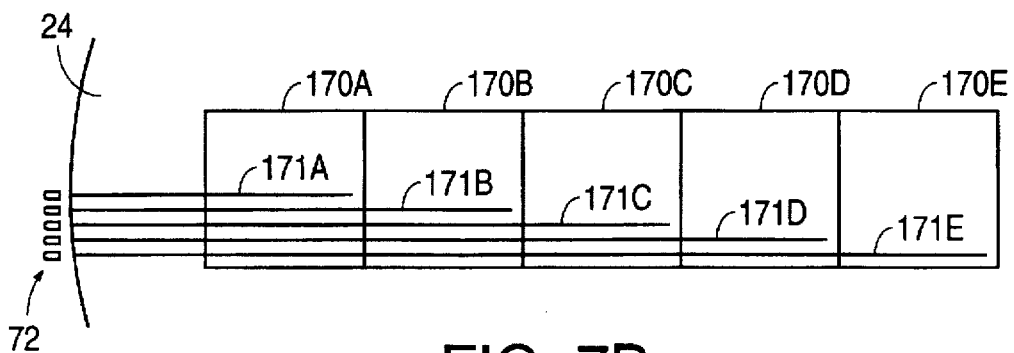
FIG. 7B illustrates the waveguides used to convey light to individual dice according to one embodiment of the invention.
Figure 7C:
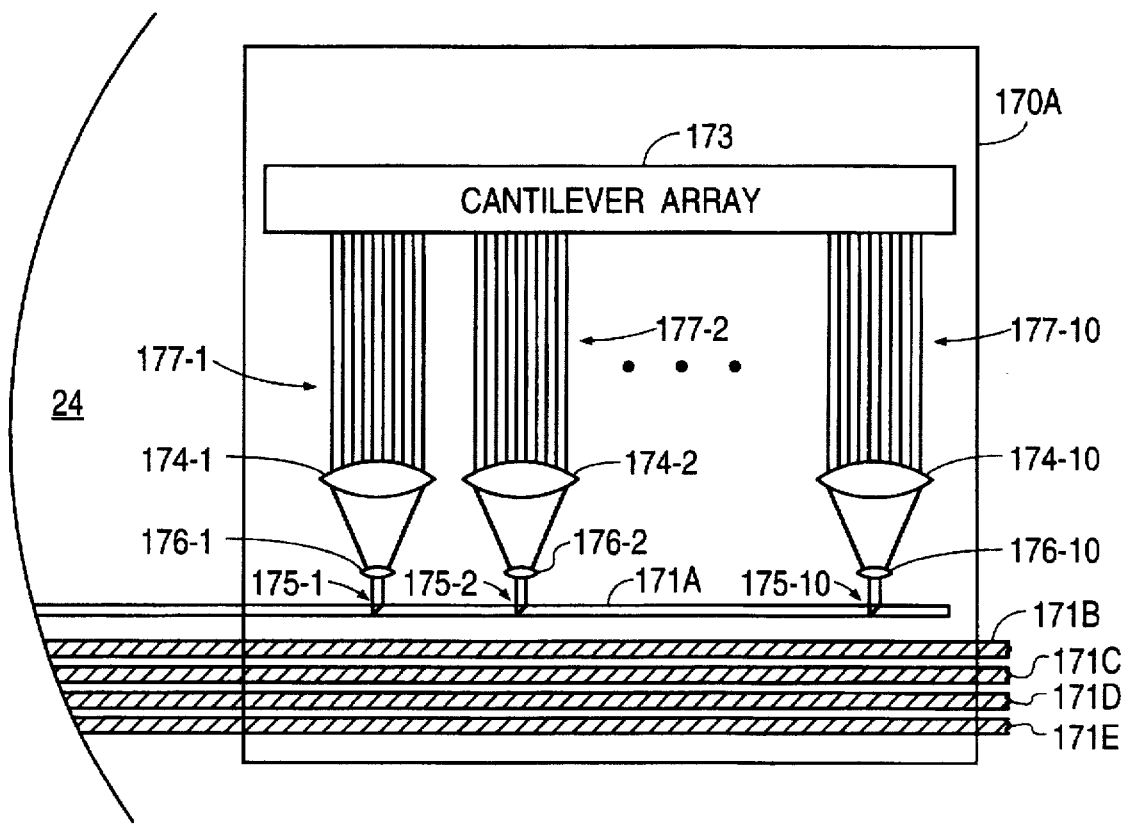
FIG. 7C illustrates the light circuitry within a single die.

An alternative arrangement for introducing the light to the planar waveguides is illustrated in FIGS. 7B and 7C. FIG. 7B illustrates a row of five adjacent dice 170A, 170B, 170C, 170D and 170E. Dice 170A–170E are also shown in FIG. 5. Also shown in FIG. 7B are a group of parallel waveguides 171A, 171B, 171C, 171D and 171E, which extend from an edge of wafer 24. Waveguide 171A extends to die 170A, waveguide 171B extends to waveguide 170B, and so forth. An array of laser diodes 172 or other suitable lasers or light sources is positioned adjacent the edge of wafer 24 and directs laser beams into adjacent ends of waveguides 171A–171E. A similar array of waveguides extends from the opposite edge of wafer 24 to dice 171F, 171G, 171H and 171I, shown in FIG. 5.

FIG. 7C illustrates the structure within die 170A. Die 170A includes a cantilever array 173 which, as noted above, contains 100 cantilevers. Die 170A also includes ten large collimating lenses 174-1 through 174-10, although to maintain the clarity of the drawing only lenses 174-1, 174-2 and 174-10 are shown in FIG. 7C. Waveguide 171A contains ten beam splitters 175-1 through 175-10, each of which splits off a portion of a laser beam traveling in waveguide 171A and directs it to one of small diverging lenses 176-1 through 176-10.

A portion of a beam of light traveling in waveguide 171A is split off by beam splitter 175-1 and passes through small lens 176-1 and large collimating lens 174-1. Large collimating lenses 174-1 through 174-10 correspond to lens 71 shown in FIG. 7A. The light beam then passes through ten light paths 177-1, each of which contains a microlens similar to microlens 72, a waveguide similar to waveguide 73, a light switch similar to light switch 74, and a waveguide similar to waveguide 75, all of which are illustrated in FIG. 7A. Similarly, other portions of the light in waveguide 171A are split off by beam splitters 175-2 through 175-10 and are directed through large collimating lenses 174-2 through 174-10 and through a plurality of parallel light paths ending at the cantilever array 173. There are a total of 100 of these parallel light paths, each of which leads to an individual cantilever within cantilever array 173.

There are numerous alternative ways of manipulating individual beams of light and directing them through light switches to individual cantilevers. Some of these techniques are described in P. K. Tien, "Integrated Optics and New Wave Phenomenon in Optical Waveguides", Review of Modern Physics, Vol. 49, No. 2, April 1977, pp. 361 et seq., which is incorporated herein by reference in its entirety.

Figure 8:
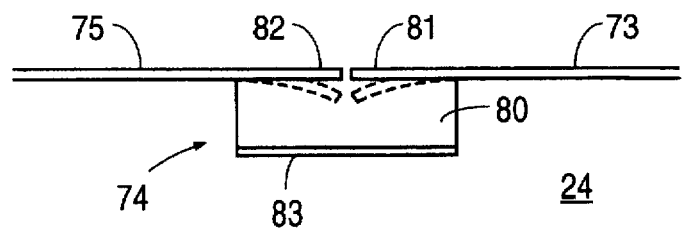
FIG. 8 illustrates a cross-sectional view of a light switch.

FIG. 8 illustrates a detailed cross-sectional view of one of light switches 74. A well 80 is formed in wafer 24. Waveguides 73 and 75 form a pair of cantilevers 81 and 82, respectively. The ends of cantilevers 81 and 82 are aligned such that light may flow from cantilever 81 to cantilever 82 when the cantilevers are in their normal position. A metal plate 83 formed at the bottom of well 80 is used to apply an electric field to cantilevers 81 and 82. The electric field deflects the cantilevers downward as shown by the dashed lines, and causes most of the light emerging from cantilever 81 to be directed into wafer 24, thereby substantially reducing the amount of light received by cantilever 82 and conveyed to one of cantilevers 76. Light switches of this kind are described in R. Watts et al., "Electromechanical Optical Switching and Modulation in Micromachined Silicon-on Insulator Waveguides", Proceedings 1991 International SOI Conference, Vail Valley, Colo., 1–3 October 1991, IEEE Publication #91CH3053-6, which is incorporated herein by reference in its entirety.

Figure 9:
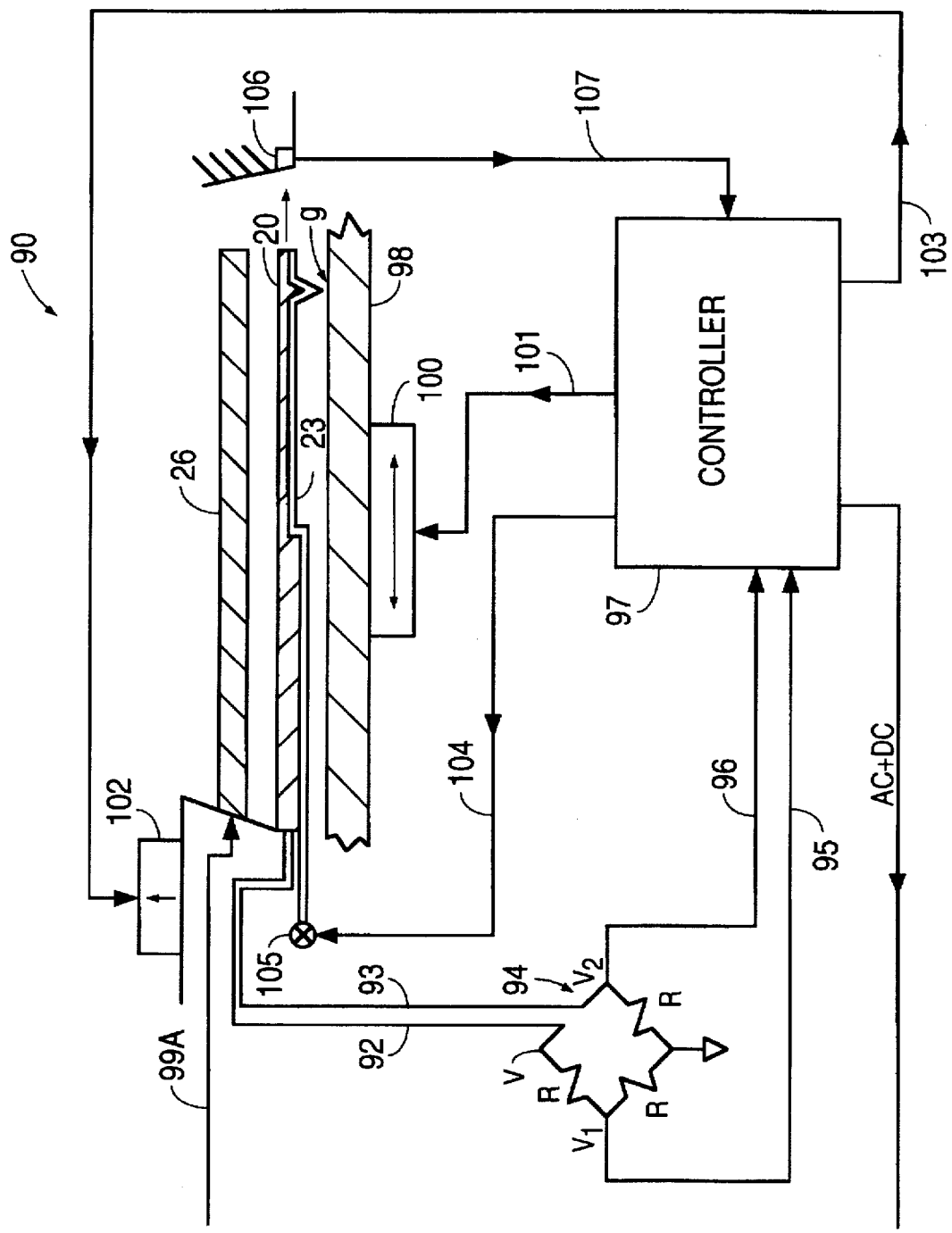
FIG. 9 illustrates a block diagram of the circuitry for controlling a single cantilever.

FIG. 9 illustrates a schematic diagram of a photolithography system 90 in accordance with the invention. Cantilever 20 includes a piezoresistor (not shown) whose terminals are connected to lines 92 and 93. Lines 92 and 93 lead to a bridge circuit 94, which has terminals connected to a voltage V and ground, respectively. The remaining terminals of bridge circuit 94 are connected to lines 95 and 96 and to a controller 97.

Bridge circuit 94 is used to detect the resistance of the piezoresistor within cantilever 20. Assuming that the resistance of the piezoresistor and each of the resistors in bridge circuit 94 is equal to R, $V_1=V_2$ when the cantilever is undeflected. When it is deflected so that the resistance of the piezoresistor becomes $R+\Delta R$, the difference between $V_1$ and $V_2$ is expressed as follows:

$$V_1 - V_2 = V \frac{\Delta R}{4R}$$

Thus, as cantilever 91 vibrates, the voltage difference $V_1-V_2$ oscillates at the same frequency, and this differential voltage is used to detect the frequency at which cantilever 20 is vibrating. This signal is delivered to controller 97 via lines 95 and 96.

Cantilever 20 is positioned with a tip extremely close to a wafer 98, the top surface of which is coated with a layer of photoresist (not shown). Waveguide 23 extends longitudinally along the bottom surface of cantilever 20, and an aperture in the waveguide is placed at the apex of the tip. A gap g, which is less than the diameter of the aperture, separates the tip from the surface of wafer 98.

A capacitive plate 26 is positioned above cantilever 20. Controller 97 delivers an AC signal to capacitive plate 26, which creates an electric field between capacitive plate 26 and cantilever 20 and causes the outer portion of cantilever 20 (i.e., the "vibrating" section) to vibrate.

As the gap g varies, the resonant frequency of cantilever 20 also varies due, as described above, to variations in the attractive forces between the tip of cantilever 20 and wafer 98. Using the output of bridge circuit 94, a rectifier (not shown) within controller 97 converts the vibrational frequency of cantilever 20 into a DC voltage, and a comparator (not shown) within controller 97 compares the DC voltage to a known reference voltage. The difference between these voltages constitutes an error voltage, and controller 97 sends a corresponding DC error signal over line 99A to capacitive plate 26. This produces a DC electric field between capacitive plate 26 and cantilever 20, and causes the thicker portion (i.e., the "bending" section) of cantilever 20 to flex. Cantilever 20 continues to flex until the gap g is adjusted to the proper level, indicating the correct spacing for proper exposure of the photoresist on the surface of wafer 98. The signal sent by controller 97 over line 99A is thus a superimposed AC-DC signal, the AC component causing cantilever 20 to vibrate and the DC component representing an error signal which adjusts the bending of cantilever 20.

Controller 97 actuates a piezoelectric device 100 via a line 101, causing wafer 98 to oscillate back and forth. Controller 97 also actuates a piezoelectric device 102 via a line 103 and thereby causes cantilever 20 to step across the surface of wafer 98. As described above, the combined oscillatory and stepping motion creates a raster scanning pattern of the kind illustrated in FIG. 6B.

Controller 97 controls the light input to cantilever 20 by providing a signal over line 104 to a light switch 105, which controls the flow of light into waveguide 23. The operation of light switch 105 is coordinated with the movement of piezoelectric devices 100 and 102, in a known manner, so that each pixel on the surface of wafer 98 is either exposed or not exposed, as necessary to create the desired photolithographic pattern on the photoresist coating the surface of wafer 98.

A photodiode 106 positioned opposite the end of cantilever 20 detects the presence of light admitted by light switch 105, and conveys this information over a line 107 to controller 97. The signal generated by photodiode 106 is used to monitor the flow of light into waveguide 23.

The AC signal delivered to capacitive plate 26 over line 99A is at a frequency which is one-half of the resonant frequency of cantilever 20. This is due to the fact that the force on cantilever 20 varies as the square of the electric field applied by capacitive plate 26. That is, $$F = \tfrac{1}{2} \epsilon E^2$$

where F is the force on cantilever 20, E is the strength of the electric field produced by capacitive plate 26, and $\epsilon$ is the dielectric constant of the substance between the capacitive plate and the cantilever (in this case air).

Since the electric field is a combined AC-DC signal, it can be represented as follows.

$$E = E_0 + E_1 \sin \omega t$$

Substituting this into the previous equation yields:

$$F = \tfrac{1}{2} \epsilon E^2 = \tfrac{1}{2} \epsilon (E_0^2 + 2 E_0 E_1 \sin \omega t + E_1^2 \sin^2 \omega t)$$

Since $\sin^2 \omega t = \tfrac{1}{2}(1 - \cos 2\omega t)$, the primary component of the force varies at a rate which is twice the rate of the applied AC signal.

The foregoing method of controlling the gap between the cantilever tip and the photoresist surface is referred to as the frequency modulation technique. As described, a feedback circuit maintains the cantilever vibrating at its resonant frequency, and the sample is moved so as to keep the resonant frequency at a constant value. An alternative method of controlling the gap between the cantilever tip and the photoresist surface is referred to as "slope detection". The cantilever is excited at a fixed frequency above its resonant frequency, and a feedback circuit moves the sample so as to maintain a constant amplitude of vibration of the cantilever. When using the slope detection technique, it is important to maintain the excitation frequency at a level above the resonant frequency to avoid crashes of the cantilever with the surface of the photoresist.

Figure 10A:
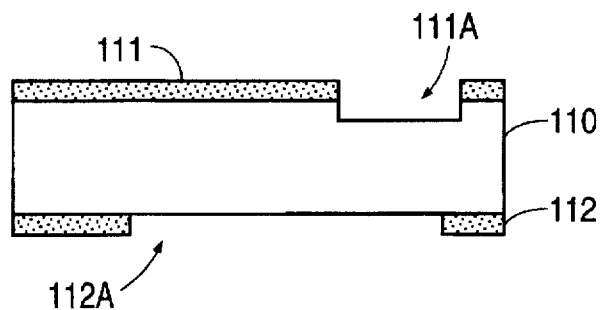
FIGS. 10A–10P illustrate a process of fabricating the cantilever.
Figure 10B:
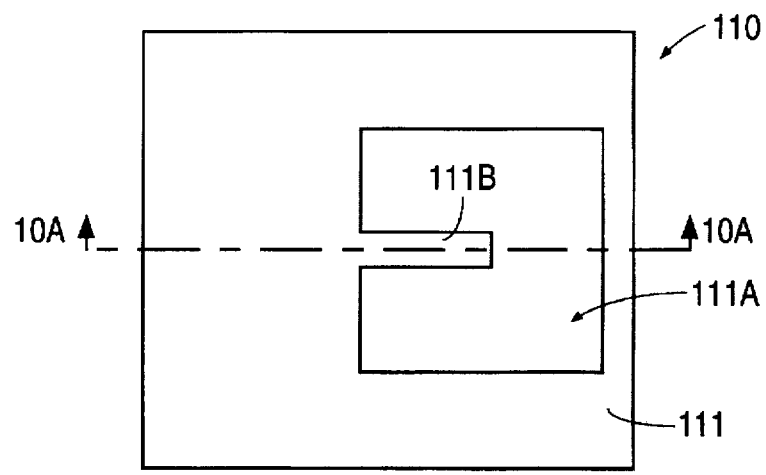
Figure 10C:
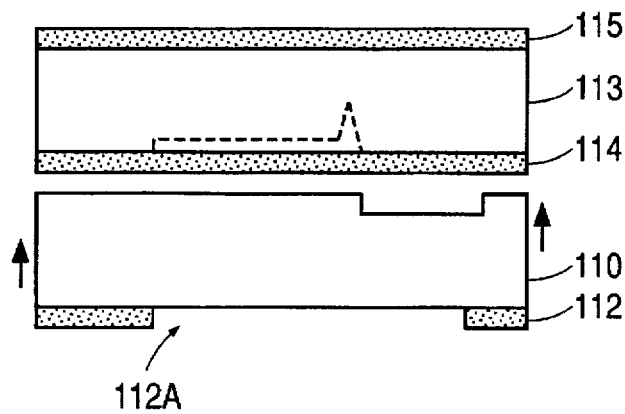
Figure 10D:
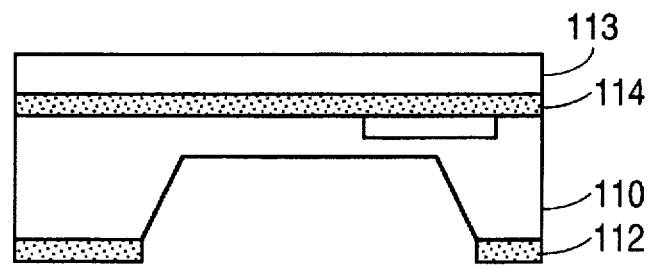
Figure 10E:
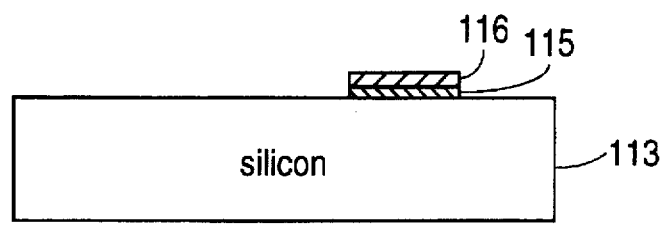
Figure 10F:
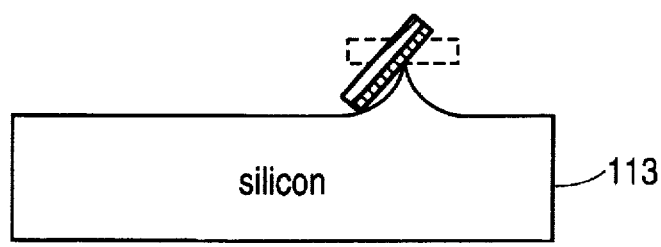
Figure 10G:
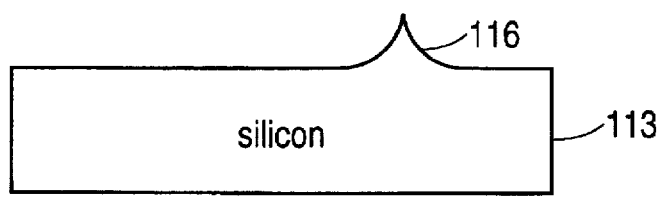
Figure 10H:
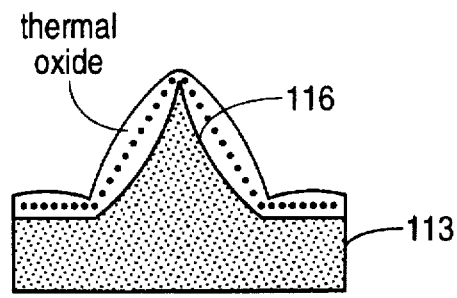
Figure 10I:
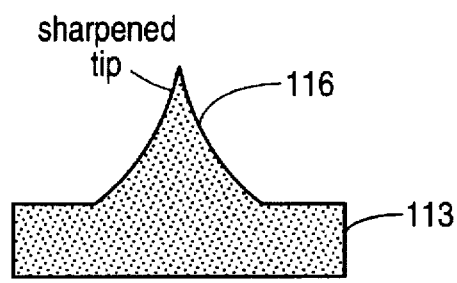
Figure 10J:
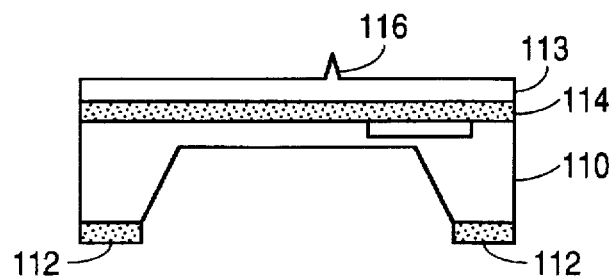
Figure 10K:
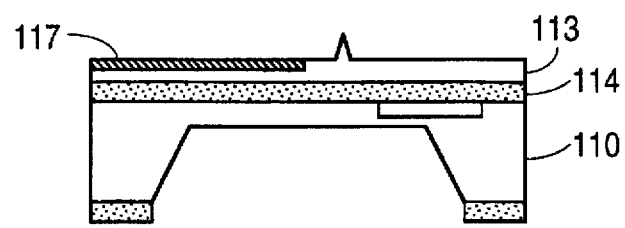
Figure 10L:
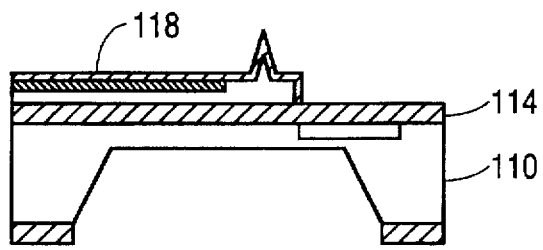
Figure 10M:
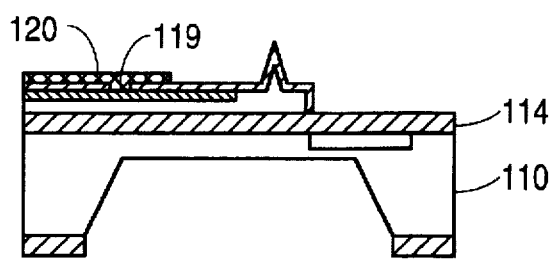
Figure 10N:
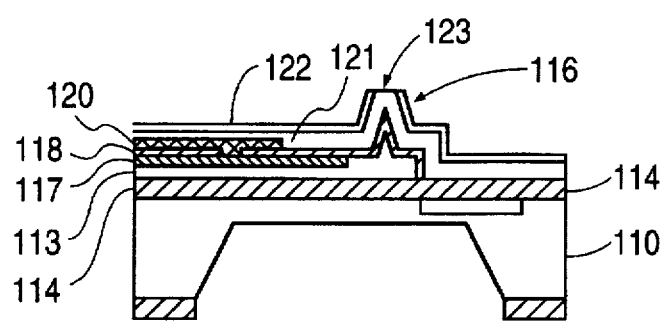
Figure 10O:
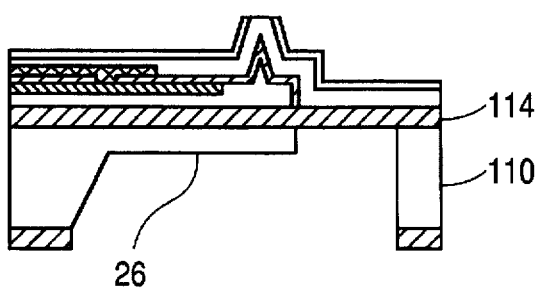
Figure 10P:
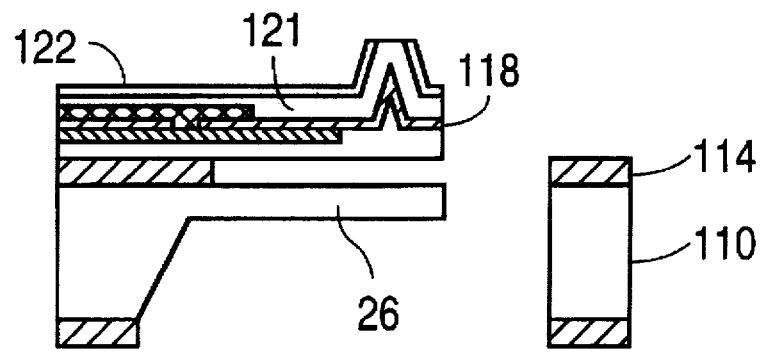

FIGS. 10A–10P illustrate the steps of a process for fabricating cantilever 20 and capacitive plate 26. The starting point is a silicon wafer 110, shown in FIG. 10A, the sides of which are patterned with $SiO_2$ layers 111 and 112. An opening 111A in $SiO_2$ layer 111 is reactive ion etched to a depth of about 20 µmm, and a window 112A is formed in layer 112. FIG. 10B, which is a view of wafer 110 from above, shows the actual shape of opening 111A and the cross section 10A—10A at which FIG. 10A is taken. A protrusion 111B marks the area where the capacitive plate will be formed.

After opening 111A is formed, $SiO_2$ layer 111 is removed, and a second wafer 113, whose surfaces are covered by $SiO_2$ layers 114 and 115, respectively, is silicon-fusion-bonded to the top surface of wafer 110. Before bonding, wafers 110 and 113 are cleaned, and their surfaces are hydrolyzed before bringing them into contact. The silicon-fusion-bonding may be performed in an oxidation furnace for four hours at about 1100° C. This part of the process is illustrated in FIG. 10C. Any undesirable $SiO_2$ formed in window 112A on the bottom of wafer 110 during this step may be removed by re-masking and buffered HF etching this side. At the same time, $SiO_2$ layer 115 is etched.

Next, wafers 110 and 113 are subjected to time-controlled KOH etching until a membrane about 30 µm thick remains on either side of $SiO_2$ layer 114. The resulting structure is illustrated in FIG. 10D. Since FIG. 10D is a cross-sectional view, it is apparent that the depression formed by the KOH etch is in the form of a truncated, four-sided pyramid.

FIGS. 10E–10G illustrate the fabrication of a tip in top silicon layer 113 (the other layers are not shown in FIGS. 10E–10G). As shown in FIG. 10E, a masking material consisting of an oxide layer 115 and a photoresist layer 116 is patterned into a circle on the top surface of layer 113. The masking material may alternatively contain a nitride, a refractory metal or any other material that is not etched by the silicon etchant. The thickness of the masking material depends on the desired height of the tip and the etch selectivity between the masking material and the silicon substrate. An oxide layer 2000 Å thick is sufficient to make tips 10 μm in height and a 1000 Å layer of evaporated aluminum may be used to make tips 100 μm in height.

Next, as shown in FIG. 10F, silicon layer 113 is etched in either a plasma or wet etchant. Although most of the etching occurs in the vertical direction, there is some finite undercutting of the mask. By carefully monitoring the etching process through periodic optical inspections, the etching can be stopped just prior to or just after the masking material caps have fallen off. These two possibilities are illustrated in FIG. 10F. In practice, the caps usually fall off and come to rest against the tip. The cap is then selectively removed and a conical tip 116 is exposed, as shown in FIG. 10G.

A possible problem with the foregoing process is that the etching conditions and durations are critical for the proper formation of the conical member. Since etching rates and durations are two of the least controllable fabrication parameters, a fabrication process that relies heavily on them is usually very difficult to reproduce from wafer to wafer or even across a single wafer. Plasma etching is very non-uniform, so that the tips in the center may take longer to form than the tips at the perimeter of the wafer. If wet etching is used, the etch time becomes more critical since the caps are washed away in the etchant and the tips are quickly attacked. It has been found that after the initial fabrication process the apexes of the conical tips typically have radii of curvature of approximately 500 Å.

In order to make the tips sharper and at the same time increase their uniformity, they can be sharpened using a low temperature thermal oxidation process, as illustrated in FIGS. 10H and 10I. FIG. 10H shows conical tip 116 after it has been thermally oxidized at 950° C. to form an oxide layer 2000 Å to 1 μm in thickness. When the oxide is selectively removed in an HF acid solution, tip 116 is sharper and has a higher aspect ratio than it had prior to oxidation. The resulting form of tip 116 is shown in FIG. 10I. This process may be repeated several times to attain the required degree of sharpness. The mechanism of oxidation that led to the sharpening process is described in detail in R. B. Marcus and T. T. Sheng, "The Oxidation of Shaped Silicon Surfaces", J. Electrochem. Soc., Vol. 129, No. 6, pp. 1278–1282, June 1982, which is incorporated herein by reference.

FIG. 10J shows the sharpened conical tip 116 protruding from top silicon layer 113.

After tip 116 is formed, boron is implanted in layer 113 at a dose of $5 \times 10^{14}$ cm$^{-2}$ and an energy of 80 keV to form a piezoresistor 117. This results in a sheet resistance of 270 Ω. Piezoresistor 117 is formed in a U-shape by masking the top surface of the substrate by a known photolithographic technique (see piezoresistor 28 in FIG. 2A). A metal mask may be used. The results of this process are illustrated in FIG. 10K.

Next, an oxide layer is formed to protect the silicon from subsequent processing. A layer 300 Å thick may be formed by wet oxidation at 900° C. for 10 minutes. A layer of photoresist is applied, and the shape of the cantilever is defined by standard photolithography techniques. During this and subsequent photolithography steps a thick photoresist layer is used to protect the tip. The silicon is then etched in a plasma etcher until oxide layer 114 stops the etch. After the photoresist is stripped, the oxide layer is removed and a new, thicker (e.g. 5000 Å) thermal oxide layer 118 is grown. The result is illustrated in FIG. 10L. This last oxidation step causes the boron to diffuse into the cantilever. Alternatively, the boron implantation could be done after the oxidation.

Another photolithography step is used to open contact holes 119 in the oxide layer 118. An aluminum layer 120 (containing 1% silicon) is sputtered, with the results shown in FIG. 10M. In one embodiment, layer 120 is 5 μm thick. Aluminum layer 120 forms the thicker ("bending") portion of the cantilever and also makes contact with the ends of photoresistor 117. Aluminum layer 120 is split to avoid a short across photoresistor 117. Aluminum layer 120 is formed by a photolithography process. A forming gas anneal at 400° C. for 45 minutes anneals the contacts.

A Si$_3$N$_4$ layer 121 is then deposited on oxide layer 118 an aluminum layer 120 by means of a low stress LPCVD (low pressure chemical vapor deposition) process. In this embodiment, Si$_3$N$_4$ layer 121 is about 3000 Å thick. An Al layer 122, preferably about 500 Å thick, is then deposited on Si$_3$N$_4$ layer 121. Si$_3$N$_4$ layer 121 forms a waveguide, bounded by oxide layer 118 and Al layer 122 (see waveguide 23 in FIG. 1). Si$_3$N$_4$ layer 121 and Al layer 122 conform to the shape of conical tip 116. An optical aperture 123 is opened at the apex of tip 116 by a focused ion beam (FIB) process. An imaging mode of the FIB generator is used to identify the location of the apex, and the FIB generator is then turned up to form optical aperture 116. The results of these processing steps are illustrated in FIG. 10N.

Reactive ion etching is then performed on the bottom of wafer 110 to form a capacitive plate 26, as shown in FIG. 10O. Finally, extended buffered HF etching of SiO$_2$ layer 113 forms a gap 125 between cantilever 20 and capacitive plate 26, as shown in FIG. 10P.

Figure 11:
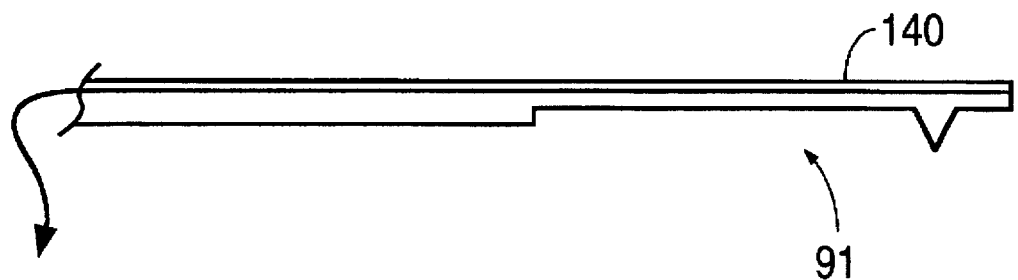
FIG. 11 illustrates an alternative embodiment of an individual cantilever.

Referring again to FIG. 9, in an alternative embodiment capacitive plate 26 is omitted, and a cantilever 91 is formed with a metal layer 140 formed on the top surface of cantilever 91, as shown in FIG. 11. Metal layer 140 could be sputtered or electroplated. Metal layer 140 is electrically insulated from the piezoresistor within cantilever 91 by the intervening silicon (see FIG. 10P).

If a current is passed through metal layer 140, metal layer 140 will heat up and cause cantilever 91 to bend in the manner of a bimetallic strip. An error signal which, as described above, represents the gap between the cantilever and the photoresist is applied to metal layer 140, causing cantilever 91 to bend until the gap is correct. In this embodiment, an AC signal applied between cantilever 91 and wafer 98 could be used to cause cantilever 91 to vibrate.

In another embodiment, a layer of a piezoelectric material such as ZnO is substituted for metal layer 140, and a voltage is applied to the piezoelectric material. This causes the piezoelectric material to expand or contract, thereby causing cantilever 91 to bend and thereby controlling the gap between the cantilever and the photoresist.

Yet another group of embodiments according to this invention dispense with the waveguides and instead expose a layer of resist by means of an electric current or an electric field applied at the tip of the cantilever.

Figure 12:
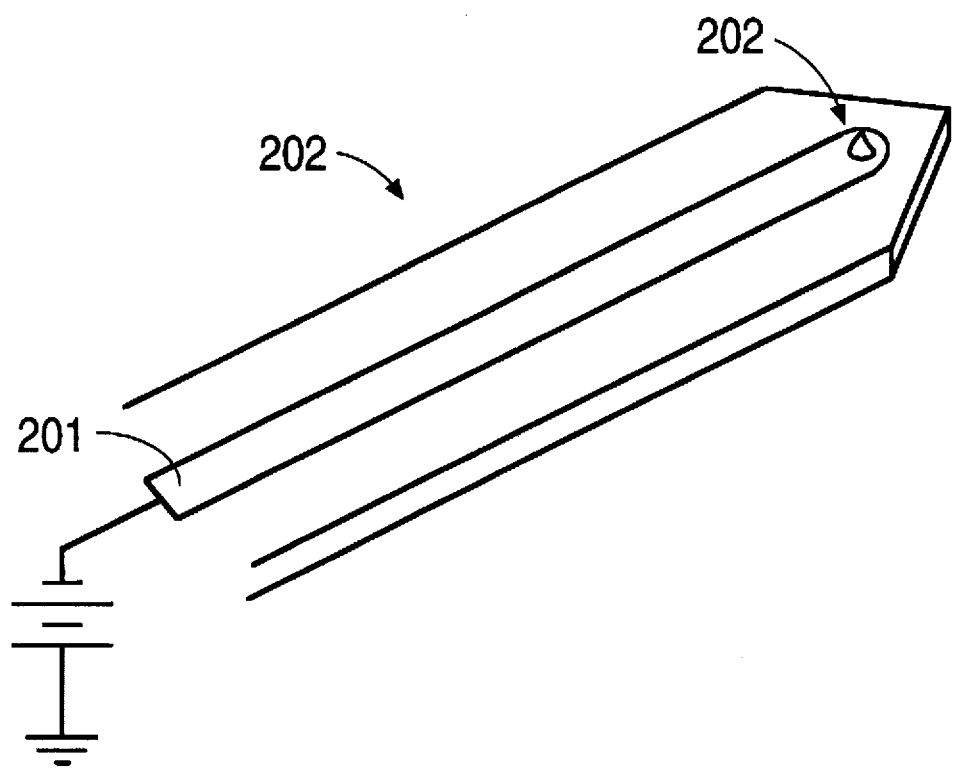
FIG. 12 illustrates a general view of an alternative form of cantilever used for performing lithography by means of an electric current or electric field.

FIG. 12 illustrates a simplified schematic diagram of a cantilever 200 in accordance with these embodiments of the invention. An electrical conductive path 201 extends from the base of cantilever 200 to a tip 202. By means of conductive path 201, tip 202 is biased with respect to the resist or substrate which is to be patterned. The lithography is performed by means of an electric current between tip 202 and the substrate or by means of an electric field which is formed at tip 202. Conductive path 201 may comprise, for example, a metallic coating applied to cantilever 200 or a region of doped semiconductor material within cantilever 200.

To perform lithography with an electric current, the substrate may be coated with a thin layer of resist, a self-assembled-monolayer (SAM), or a thicker multilayered surface imaging resist. These are resists which respond to electrons (rather than photons) and are commonly used to expose patterns with electrons from a scanning electron microscope. The use of an ultrathin film of poly (methylmethacrylate) (PMMA) to serve as either a positive or negative resist for an electron current is described in A. Majumdar et al., "Nanometer-scale lithography using the atomic force microscope", Appl. Phys. Lett. 61 (19), 9 November 1992, pp. 2293–2295. The use of self-assembled monolayers (SAMs) as an electron resist is described in J. M. Calvert, "Lithographic patterning of self-assembled films", J. Vac. Sci. Technol. B11(6), November/December 1993, pp. 2155–2163; R. C. Tiberio et al., "Self-assembled monolayer electron beam resist on GaAs", Appl. Phys. Lett. 62(5), 1 February 1993, pp. 476–478; and C. R. K. Marrian et al., "Low voltage electron beam lithography in self-assembled ultrathin films with the scanning tunneling microscope", Appl. Phys. Lett. 64(3), 17 January 1994, pp. 390–392. Each of the foregoing articles is incorporated herein by reference.

In an alternative technique, the surface of a crystalline silicon substrate is oxidized to form an etch stop. In the preferred method, the silicon surface is passivated by cleaning it and dipping it in a solution containing hydrogen. Hydrogen from the solution bonds to dangling bonds on the silicon surface and forms a passivating monolayer free from the dangling silicon bonds. The passivated surface is exposed to an intense electric field in the presence of water vapor or oxygen. The electric field disrupts the bond between the silicon and hydrogen atoms and thereby exposes a fresh silicon surface. The molecules of water vapor are activated by the electric field, and the free oxygen that results from this activation process combines with the exposed silicon atoms to form an oxide layer. This process is described in E. S. Snow et al., "Fabrication of Si nanostructures with an atomic force microscope", Appl. Phys. Lett. 64(15), 11 April 1994, pp. 1932–1934, which is incorporated herein by reference. This process may also be performed with amorphous silicon and polysilicon.

Unpassivated silicon surfaces grow a thin layer of native oxide when exposed to air. If the above described electric field-enhanced oxidation process is carried out on an oxidized silicon surface, the thickness of the oxide in the region exposed to the electric field will increase, and this thick oxide may be used as an etch stop. This process is described in L. Tsau et al., "Nanometer scale patterning of silicon (100) surfaces by an atomic force microscope operating in air", Appl. Phys. Lett. 64(16), 18 April 1994, pp. 2133–2135, which is incorporated herein by reference.

Certain metals, such as aluminum, chromium and titanium, are also oxidized by an intense electric field in the presence of water molecules. It is believed that the intense electric field disassociates the water molecules and frees the oxygen to interact with the metal surface to form an oxide. Chromium oxide or dioxide is formed on a chromium surface and titanium oxide is formed on a titanium surface. The oxidation of chromium is described in H. J. Song et al., "25 nm chromium oxide lines by scanning tunneling lithography in air," presented at the 38th International Symposium on Electron, Ion and Photo Beams, New Orleans, La., May 31–Jun. 3, 1994, and the oxidation of titanium is described in H. Sugimura, "Tip-induced anodization of titanium surfaces by scanning tunneling microscopy; A humidity effect on nanolithography", Appl. Phys. Lett. 63(9), 30 August 1993, pp. 1288–1290, both of which are incorporated herein by reference.

To use each of these techniques in accordance with this invention, an array of cantilevers is formed as described above, and a conductive path is provided to the tip of each cantilever in the array. Exposure of the layer of resist or substrate surface is controlled by switching the electric current or electric field at the tip of the cantilever or, alternatively, by causing the cantilever to bend away from the substrate so as to interrupt the electric current or remove the effect of the electric field. An array of cantilevers is provided as described above, and the entire array is caused to be scanned, preferably in a raster pattern. The width of the electric field or electric current at each cantilever tip determines the area which is exposed during each scan.

The cantilevers are preferably operated in the contact mode (i.e., the tips are in contact with the surface to be patterned), but they may also be operated in the non-contact mode. A means is provided for detecting the deflection of each cantilever (preferably a piezoresistor embedded in the cantilever) and a means is provided for causing the cantilever to bend or vibrate (preferably a piezoelectric element formed on the cantilever). If the cantilevers are being operated in the contact mode, the deflection detector senses the bending of each cantilever and the bending element causes each cantilever to bend such that a constant force is maintained between the tip and the surface as the individual cantilevers pass over undulations in the surface of the substrate.

In the non-contact mode, a superimposed AC/DC signal is applied to the bending component, the AC signal being used to cause the cantilever to vibrate and the DC signal controlling the deflection (neutral position) of the cantilever. The deflection detector senses the frequency at which the cantilever vibrates. If the vibrational frequency of the cantilever departs from a desired level, indicating that the gap between the tip and substrate is incorrect, the bending element is adjusted to bring the cantilever back to a proper tip-substrate separation. In the case of a piezoelectric element, this adjustment is made by varying the DC signal that is applied to the element.

According to still another alternative embodiment, the tip of the cantilever may be used to scribe lines in a thin layer on the surface of the substrate, e.g., a layer of a polymer material such as PMMA. In this way, a trench is formed in the thin layer, and the remaining portions of the layer act as an etch stop. T. A. Jung et al., "The atomic force microscope used as a powerful tool for machining surfaces", Ultramicroscopy, 42–44, 1992, pp. 1446–1451, describes a system in which the trenches formed in the thin polymer film are enhanced by vibrating the cantilever as it impacts the thin layer. H. J. Mamin et al., "Thermomechanical writing with an atomic force microscope tip", Appl. Phys. Lett. 61(8), 24 August 1992, pp. 1003–1005, improve on this process further by heating the thin layer to the softening point while pressing the tip into the film. Both of the foregoing articles are incorporated herein by reference.

Figure 13A:
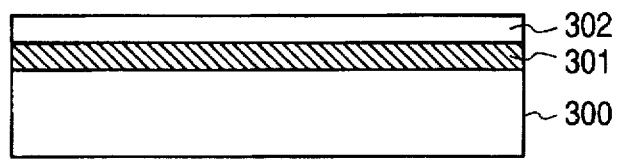
FIGS. 13A–13AA illustrate the steps of fabricating a cantilever of the kind shown in FIG. 12.

FIGS. 13A–13AA illustrate a process of fabricating one of the cantilevers in a cantilever array in accordance with this embodiment of the invention. It will be apparent that FIGS. 13A–13AA are not drawn to scale, the vertical axis being expanded to allow the various layers of the cantilevers to be clearly shown.

Figure 13B:
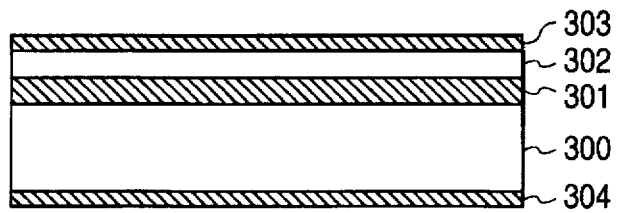
Figure 13C:
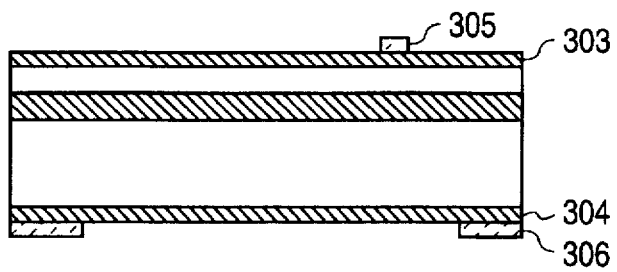
Figure 13D:
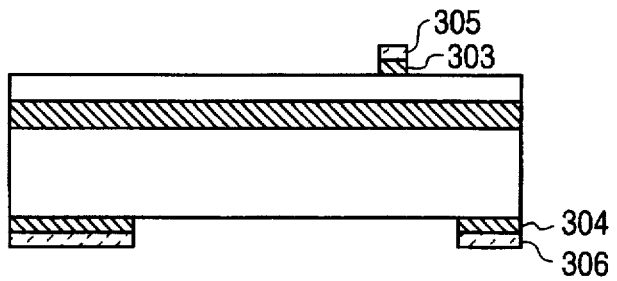

The starting point is a <100> silicon-on-insulator (SOI) wafer which includes a silicon substrate 300, a middle oxide layer 301 and a top silicon layer 302. In a preferred embodiment, silicon substrate 300 is 450 µm thick, middle oxide layer 301 is 1 µm thick, and top silicon layer 302 is 10 µm thick. As shown in FIG. 13B, oxide layers 303 and 304, preferably 1 μm thick, are grown on the top and bottom of the structure. This may be accomplished by wet oxidation at 1100° C. for 2 hours and 25 minutes. As shown in FIGS. 13C and 13D, oxide layers 303 and 304 are patterned with photoresist layers 305 and 306 and etched. The etching process may be performed in a 6:1 buffered oxide etch (BOE) solution for ten minutes.

Figure 13E:
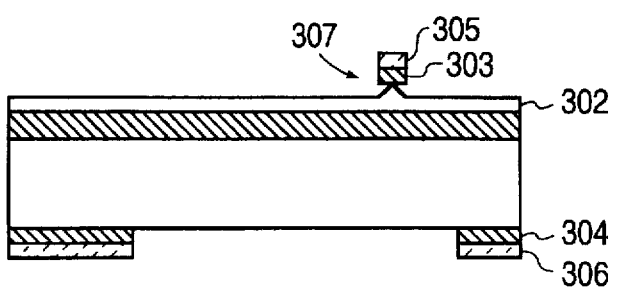
Figure 13F:
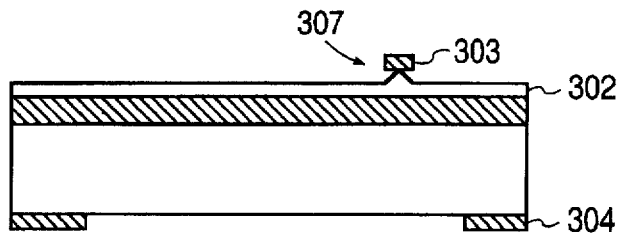
Figure 13G:
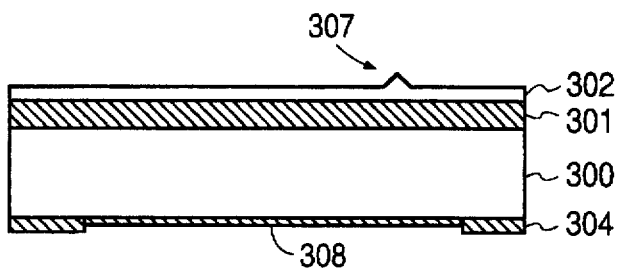

As shown in FIGS. 13E and 13F, top silicon layer 302 is etched, forming a tip 307 beneath the remains of oxide layer 303 and photoresist layer 305, and photoresist layers 305 and 306 are stripped. Top silicon layer 302 is then repeatedly oxidized and etched to sharpen tip 307 in a process similar to that described above in connection with FIGS. 10H and 10I. This may be accomplished by growing a wet oxide at 950° C. for 40 minutes and etching the oxide layer. This process also forms a new oxide layer 308 on the bottom of the structure having a thickness of about 0.79 μm.

Figure 13H:
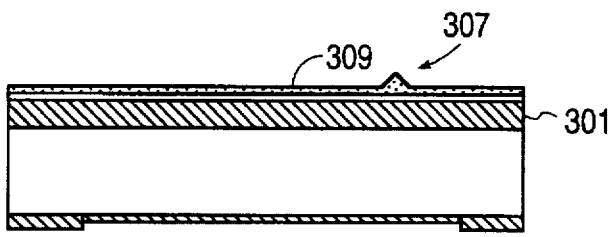
Figure 13I:
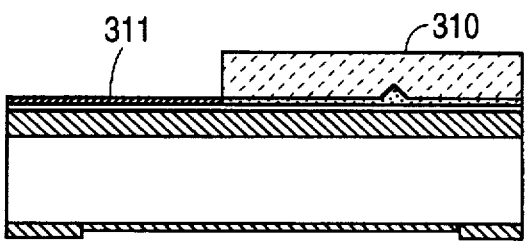
Figure 13J:
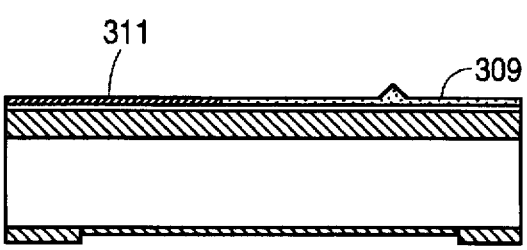

As shown in FIG. 13H, the top surface of the structure is implanted with P-type dopant to form a piezoresistor 309 which extends to the tip 307. This is preferably accomplished with boron ions at a dosage of $5 \times 10^{14}$ cm$^{-2}$ and an energy of 80 keV. As shown in FIG. 13I, the top surface of the structure is then patterned with a thick photoresist layer 310 that protects the tip 307, and a P-type dopant is implanted to form a P+ conductive region 311. Photoresist layer 310 is preferably AZ4620 photoresist. The implantation of the P-type dopant is accomplished with boron ions at a dosage of $5 \times 10^{16}$ cm$^{-2}$ at an energy of 80 keV. Thus the first P-type implantation described in FIG. 13H forms a piezoresistor, and the second P-type implantation described in FIG. 13I forms a conductive element. Photoresist layer 310 is then stripped, as shown in FIG. 13J, leaving the piezoresistor 309 and the conductive region 311. FIG. 13J1 is a plan view showing the shape of piezoresistor 309 and conductive region 311. Cross section line 13J—13J shows the section at which the view of FIG. 13J is taken.

Figure 13K:
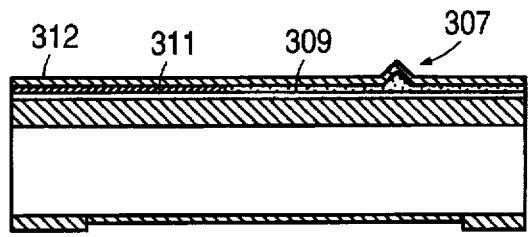
Figure 13L:
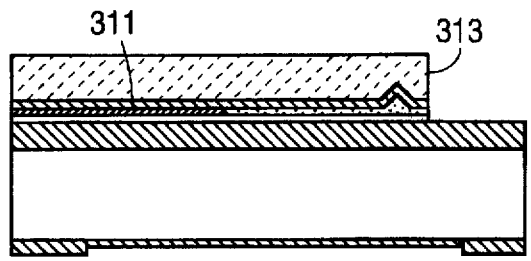

Next, as shown in FIG. 13K, a thin oxide layer 312 is grown on the top surface of the structure. Oxide layer 312 may be grown by a wet process at 900° C. for ten minutes to achieve a thickness of 270 Å. If desired, oxide layer 312 may be removed from the region of the tip 307 in an additional photolithographic step.

Figure 13M:
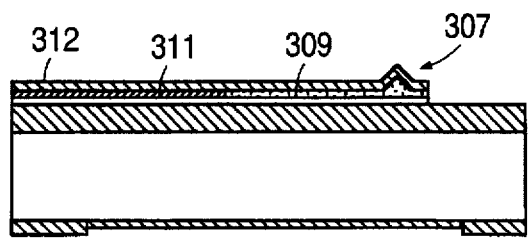
Figure 13N:
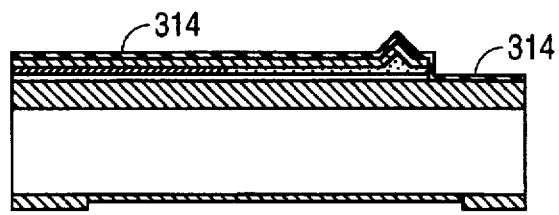

A photoresist layer 313 is deposited to define a cantilever, and oxide layer 312 and top silicon layer 302 are etched to form a cantilever 316. Photoresist layer 313 is then removed (FIG. 13M). The shape of cantilever 316 is illustrated in the plan view of FIG. 13M1, with the tip 307 being located near the point of the cantilever 316 and conductive region 311 and piezoresistor 309 forming a conductive path which includes tip 307. Cross-section line 13M—13M indicates the section at which FIG. 13M1 is taken.

Figure 13O:
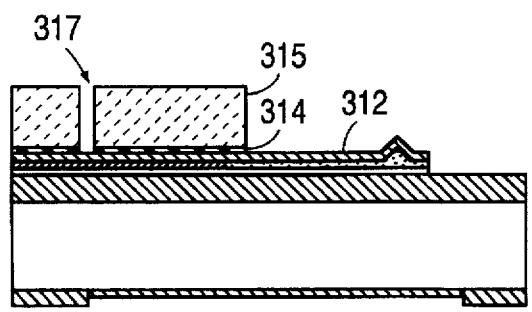
Figure 13P:
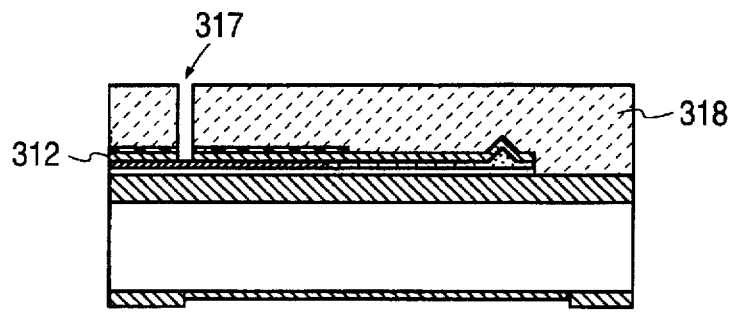

A nitride buffer layer 314 is deposited over the top surface of the structure. Buffer layer 314 is preferably a low stress PECVD nitride layer about 0.2 μm thick. A photoresist layer 315 is then deposited on top of buffer layer 314 and buffer layer 314 is etched so as to form a contact region 317. This step is illustrated in FIG. 13O. Photoresist layer 315 is preferably an AZ4620 photoresist, and an RIE (reactive ion etch) process is used to etch nitride buffer layer 314.

Photoresist layer 315 is stripped, and a new photoresist layer 318 is deposited so as to expose oxide layer 312 in contact region 317. Photoresist layer 318 is preferably AZ4620 photoresist. Oxide layer 312 is then etched, preferably using a 6:1 BOE solution for two minutes. Photoresist layer 318 is then stripped.

Figure 13Q:
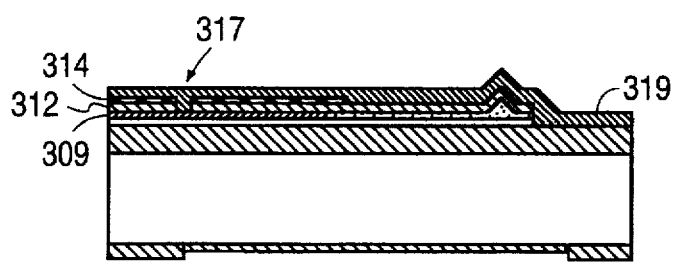

A first metal layer 319 is then deposited over the entire surface of the structure, filling contact region 317 and establishing a contact with conductive region 311. This step is illustrated in FIG. 13Q. First metal layer 319 is preferably formed by evaporating aluminum to a thickness of 0.5 μm on a cold substrate.

Figure 13R:
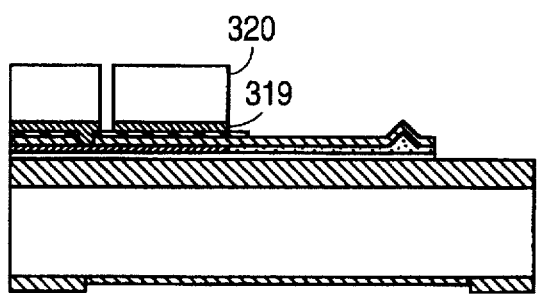

A photoresist layer 320 is deposited and first metal layer 319 is etched, as shown in FIG. 13R. In the preferred embodiment, the aluminum layer which forms first metal layer 319 is etched by a wet process. A plan view of first metal layer 319 is shown in FIG. 13R1, which indicates the location of contact region 317 and a second contact region 317A formed opposite contact region 17. FIG. 13R is taken through the section line designated 13R—13R in FIG. 13R1.

Figure 13S:
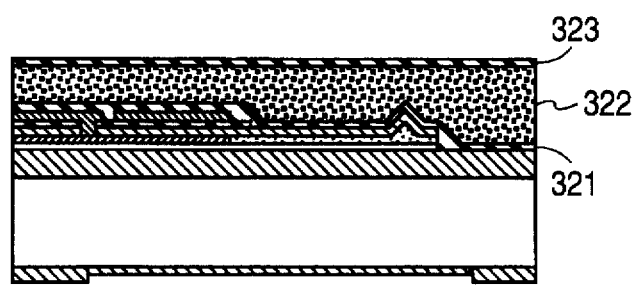

Referring next to FIG. 13S, after photoresist layer 320 has been stripped, a 0.2 μm thick PECVD nitride buffer layer 321, a 3.5 μm thick ZnO layer 322, and a 0.2 μm thick PECVD nitride buffer layer are deposited in succession over the top surface of the structure. The sandwich of ZnO layer 322 and nitride buffer layers 321 and 323 will form a piezoelectric element as described below. A pair of terminals 319T form an electrical contact to the bottom electrode of the piezoelectric element.

Figure 13T:
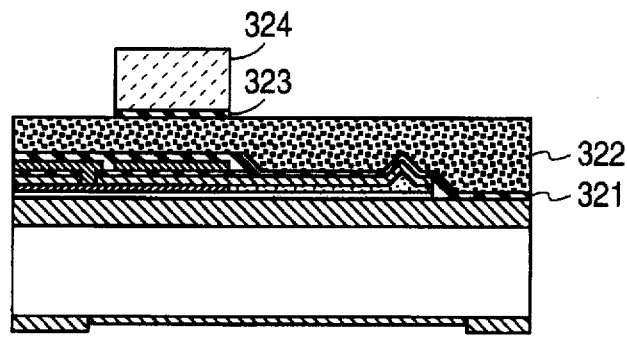
Figure 13U:
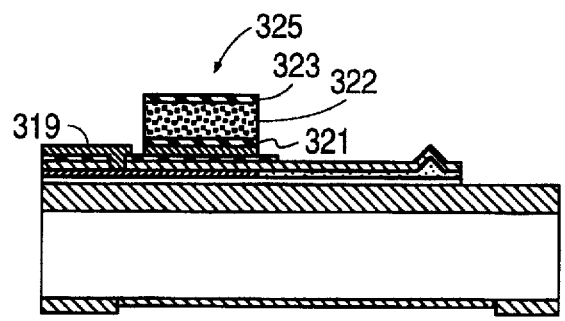

A thick photoresist layer 324 (preferably AZ4620) is then deposited and nitride buffer layer 323 is etched using an RIE etch. The resulting structure is shown in FIG. 13T. Using buffer layer 323 as a mask, ZnO layer 322 is then etched, and nitride layer 321 is RIE etched. After photoresist layer 321 is stripped in an oxygen plasma, the structure shown in FIG. 13U emerges. FIG. 13U1 is a plan view of ZnO layer 322, with the cross section line 13U—13U denoting the section at which FIG. 13U is taken.

Figure 13V:
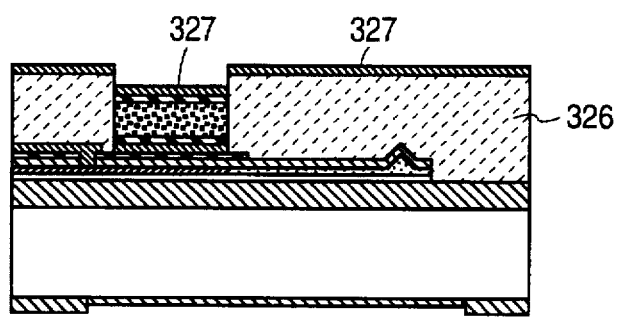

A photoresist layer 326 is then deposited as shown in FIG. 13V. Photoresist layer 326 is preferably a chlorobenzene treated AZ4620 photoresist. A second metal layer 327 is then deposited on the top surface of the structure, second metal layer 327 preferably being aluminum which is evaporated to a thickness of 0.5 microns. Photoresist layer 326 is then etched, lifting off a portion of second metal layer 327 and yielding the structure shown in FIG. 13W. As is evident from FIG. 13W, first metal layer 319 and second metal layer 327 form the bottom and top electrodes, respectively, of the ZnO piezoelectric element 325.

Figure 13W:
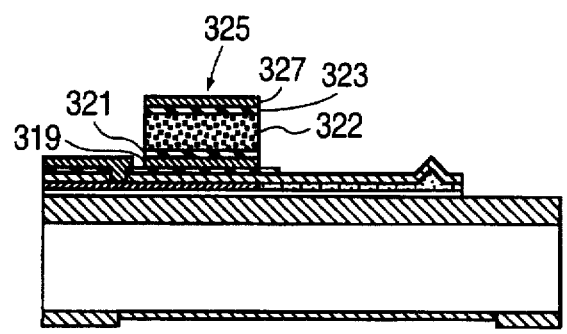

FIG. 13W1 is a top view of the structure at this point, with cross section line 13W—13W indicating the section at which FIG. 13W is taken. As is apparent from FIG. 13W1, second metal layer 327 extends to the sides of the structure in the region beyond the base of the cantilever 316. In these regions, ZnO layer 322 (FIG. 13U1) merely acts as an insulating layer beneath second metal layer 327. A terminal 327T forms an electrical contact to the top electrode of piezoelectric element 325. A third metal layer (not shown) is then deposited on contact regions 317 and 317A, terminals 319T and terminal 327T to increase the thickness of the aluminum in these areas to at least 1.0 μm.

Figure 13X:
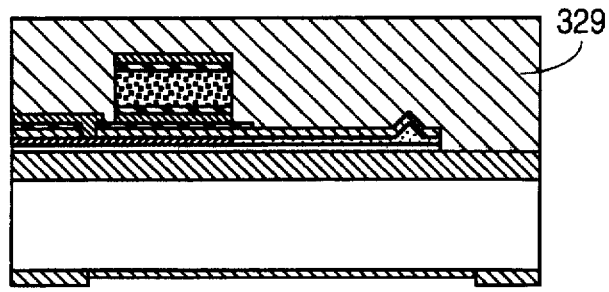
Figure 13Y:
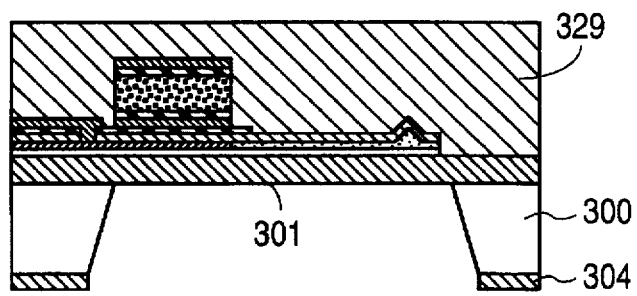

Next, as shown in FIG. 13X, a thick layer of PIQ 3600 polyimide (available from Hitachi) is spun on the top surface of this structure, preferably for 2 minutes at 500 RPM. The structure is then baked for 2 hours at 350° C. The bottom surface of the structure is then etched using an ethylene diamine and pyrocatechol (EDP) etch at 105° C., as shown in FIG. 13Y. EDP can be purchased as a premixed anisotropic silicon etchant. Other etchants such as tetramethyl ammonium hydroxide (TMAH) or hydrazine may also be used. The etchant used should be anisotropic and be highly selective against silicon dioxide and must not interfere with the circuitry. The result is to remove a portion of silicon layer 300, exposing the bottom surface of oxide layer 301.

Figure 13Z:
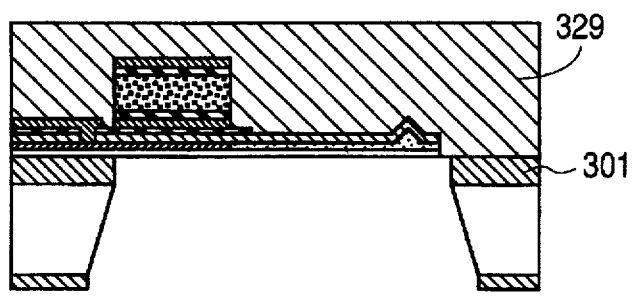
Figure 13A:
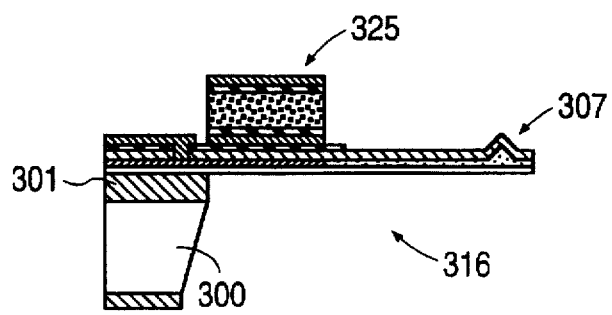

Oxide layer 301 is then etched, preferably with a 6:1 BOE solution. This yields the structure shown in FIG. 13Z.

Finally, polyimide layer 329 is removed freeing the cantilever 316 as shown in FIG. 13AA.

Figure 14A:
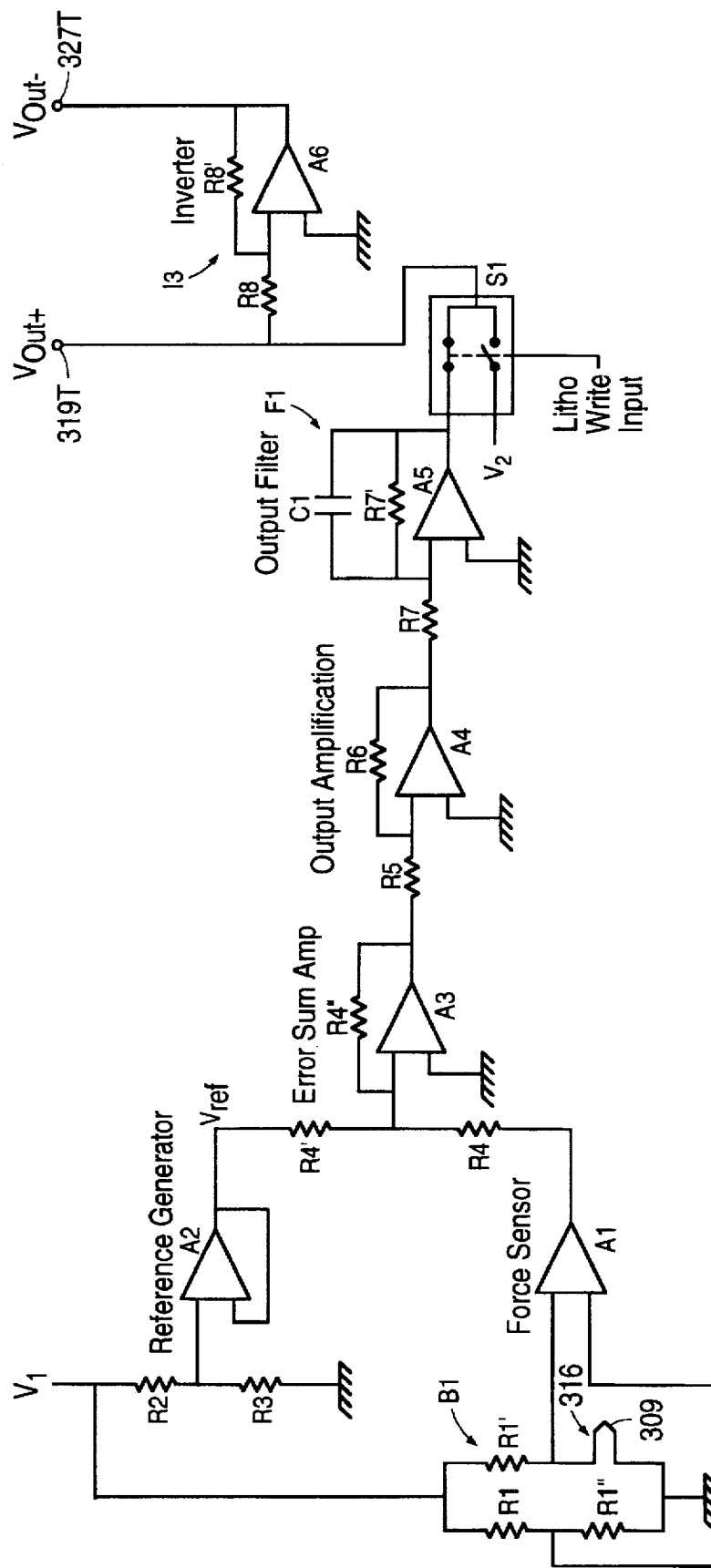
FIGS. 14A and 14B illustrate circuitry for controlling a cantilever of the kind shown in FIG. 12.
Figure 14B:
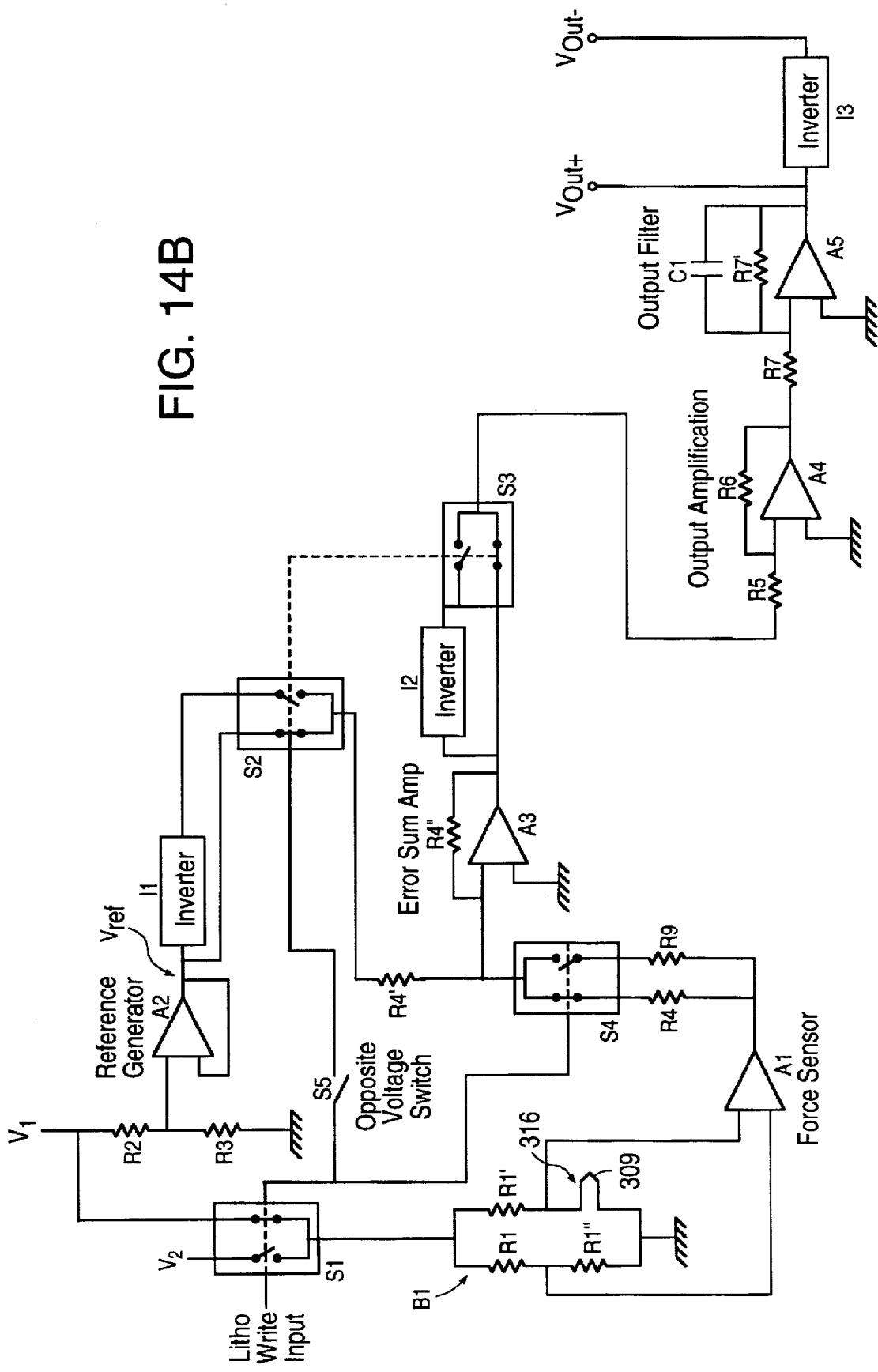

FIGS. 14A and 14B illustrate in schematic form the circuit that is used to control cantilever 316 during the photolithographic process. It should be understood that the components illustrated in FIGS. 14A and 14B are fabricated in integrated form on board the wafer, with a corresponding control circuit being used to control separately each cantilever in the array. The manner of fabricating the individual components in FIGS. 14A and 14B in integrated circuit form is well known to those skilled in the art and will not be described here.

FIG. 14A illustrates a control circuit that is used to interrupt the write process (i.e., the exposure of the resist or substrate by an electric current or electric field) by lifting the cantilever away from the surface. In this manner, the electric current or electric field ceases and the consequent action on the resist or substrate (e.g., the exposure of a resist layer or oxidation of a substrate material) is terminated. Piezoresistor 309 is connected in a bridge circuit B1 which is supplied by a constant voltage $V_1$. The bridge circuit includes resistors R1, R1' and R1", each of which is precision matched to piezoresistor 309. The values of resistors R1, R1' and R1" are set such that the voltage at the tip of the cantilever is equal to $V_1/4$. The outputs of the bridge circuit B1 are delivered to respective inputs of an amplifier A1, which is a high precision, high gain, low noise, operational amplifier. The voltage $V_1$ is also supplied to a voltage divider consisting of resistors R2 and R3, which are set to provide a voltage which is passed through a high precision operational amplifier A2 to provide a reference voltage $V_{ref}$. In FIGS. 14A and 14B, the resist layer and substrate are at system ground potential.

The outputs of amplifiers A1 and A2 are passed through matched resistors R4 and R4', respectively, to the input of an error sum amplifier A3, which provides a unity gain. A precision operational amplifier A4 amplifies the output of error sum amplifier A3, the gain being determined by resistors R5 and R6.

The signal is then passed through a low pass filter F1 which includes a capacitor C1, an operational amplifier A5, and resistors R7 and R7'. Amplifier A5 is an integrating operational amplifier which filters out high frequencies in order to maintain stability in the feedback loop while at the same time enhancing the feedback loop by using previously acquired information to "predict" new information (the feedback loop in this case includes the piezoelectric element 325, the operation of which affects the resistance of piezoresistor 309.) The integrator gain of amplifier A5, which determines the slope of changes in the output, is equal to 1/(R7×C1). The resistors R7 and R7' are set at the same value to keep the magnitude gain constant. (The magnitude gain is set in amplifier A4.) Therefore, capacitor C1 determines the integrator gain. If the value of C1 is increased, the integrator gain is decreased, causing amplifier A5 not to respond to frequencies above the gain (1/RC). Filtering of the high frequencies makes the feedback loop more stable but less sensitive. To enhance sensitivity, the integrator gain should be set as high as possible without making the feedback loop become unstable. Other factors which contribute to the maximum integrator gain are the scan speed, the gain of amplifier A4, and the topology of the imaged surface.

The output of filter F1 is passed through a double-pole switch S1 and to a pair of outputs $V_{Out+}$ and $V_{Out-}$. An inverter I3, containing an amplifier A6 and resistors R8 and R8' ensures that $V_{Out-}$ has the same absolute magnitude but opposite sign as $V_{Out+}$. $V_{Out+}$ and $V_{Out-}$ are delivered to terminals 319T and 327T shown in FIG. 13W1, which, as described above, are the poles of the piezoelectric element 325.

The other current path through switch S1 is connected to a constant voltage $V_2$. The voltage $V_2$ is set at a level such that when $V_{Out+}=V_2$ and $V_{Out-}=-V_2$ the cantilever is bent away from the surface of the substrate. The lithographic write input is connected to switch S1 and, when activated, connects the output of filter F1 to terminals 319T and 327T.

When the cantilever is writing, the resistance of piezoresistor 309 varies as the cantilever flexes. Bridge circuit B1 therefore delivers varying outputs to amplifier A1. Error sum amplifier A3 compares the output of amplifier A1 against the reference voltage $V_{ref}$ and transmits the signal for amplification to amplifier A4. High frequency components of the signal are filtered by filter F1 and the resultant signal and its inverse are delivered to terminals 319T and 327T as $V_{Out+}$ and $V_{Out-}$. $V_{Out+}$ and $V_{Out-}$ are used for imaging purposes and also to control the piezoelectric element 325 so as to maintain a constant force between the tip 307 and the surface of the substrate. Thus, with switch S1 in this position, the cantilever operates in the manner of a conventional atomic force microscope.

As noted above, the voltage at the tip 307 is equal to $V_1$ divided by 4. $V_1$ is set such that $V_1/4$ is above the threshold (voltage that is required) to establish an electric field or electric current which causes the desired process to take place at the point where tip 307 makes contact with the surface of the substrate or resist layer. For example, a lithography using an electric current might require a threshold tip voltage of +10 V with respect to the substrate (which is assumed to be grounded). If so, $V_1$ could be set at +41 V. Alternatively, to perform lithography by oxidation, where the tip is normally negatively biased with respect to the substrate, $V_1$ might be set at −28 V, for example.

The circuit of FIG. 14A can be modified to perform lithography by causing the tip to form a trench or furrow in a thin layer of a soft material such as PMMA. In this embodiment, $V_2$ is set such that the cantilever will press the tip into the thin layer, and lithography is performed when $V_2$ is connected to the outputs. At other times the system operates as an atomic force microscope, as described above, and the soft thin layer is not scribed. Any material that is softer than the tip could potentially be used to form the thin layer. Possibilities include photoresist, self assembled monolayers and soft metals.

Figure 15:
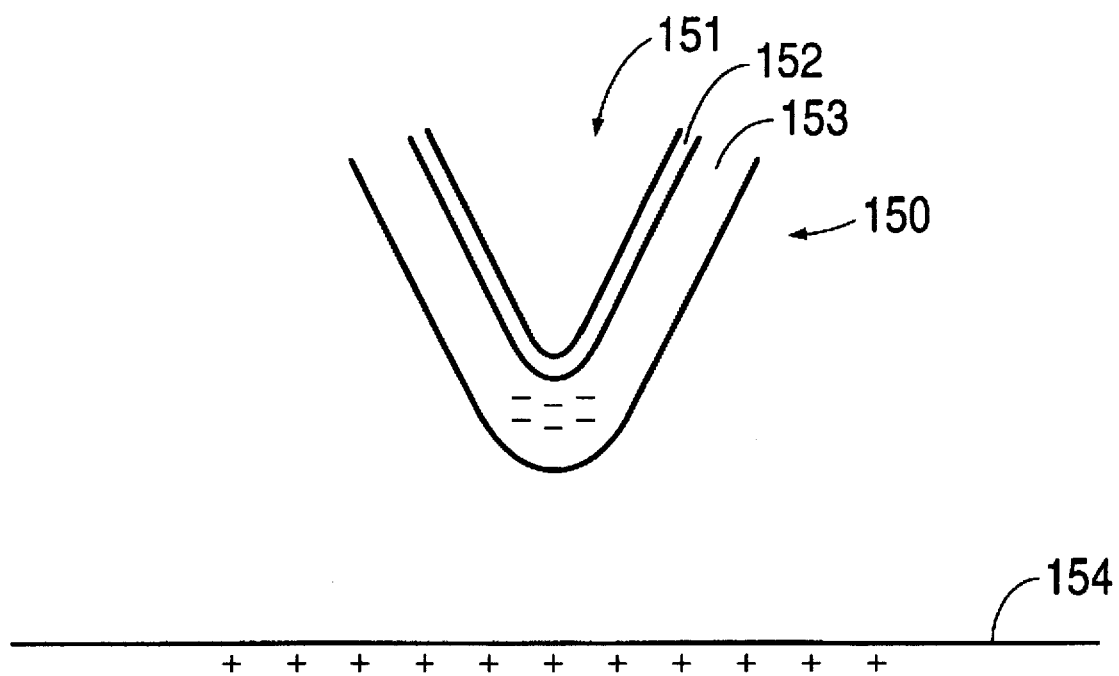
FIG. 15 illustrates a detailed cross-sectional view of a cantilever tip on which an electrical charge is stored.

The control circuit shown in FIG. 14A may also be used to perform electric field lithography using charge trapped at the apex of the cantilever tip. FIG. 15 illustrates a detailed cross-sectional view of a cantilever tip 150. An underlying silicon tip 151 is covered by an oxide layer 152 and a nitride layer 153. Negative charge is trapped in the nitride layer 153 and produces an electric field between cantilever tip 150 and a substrate 154. This electric field may be used to perform lithography as described above.

The nitride-oxide-silicon (NOS) structure at the tip shown in FIG. 15 may be formed by depositing 50 Å of thermal oxide following by 450 Å of silicon-nitride onto the bare silicon tip 151. The thermal oxide may be deposited at 800° C. for 30 minutes in dry oxygen, and the nitride may be deposited by a low pressure chemical vapor deposition process. Oxide layer 152 and nitride layer 153 may be deposited at any time after tip 151 has been sharpened, as described above, but before the cantilevers are freed in the backside etch (FIG. 13Y). Preferably, this is done immediately after the tip is sharpened (FIGS. 10H and 10I). Oxide layer 152 and nitride layer 153 are deposited on the exposed cantilever and are removed from regions such as the contacts, piezoresistor and electrical circuitry where their presence might create a problem.

Nitride layer 153 is charged by placing it in contact with a conductor and creating a large bias (e.g., 25–40 volts) between the conductor and silicon tip 151. This bias causes charge from the silicon tip 151 to tunnel through the oxide layer 152 and become trapped in the nitride layer 153. Once the charge has been trapped in the nitride layer 153, the bias can be removed and the charge will remain fixed.

In one application, after the cantilevers were completely fabricated the tips were brought into contact with a conducting substrate. A bias, either DC or pulse, was then applied to the conducting substrate to trap charge in the tips. The die, from which the cantilevers are electrically isolated, was grounded, and the tip and cantilever were allowed to "float" electrically.

The bias needs to be applied only for several seconds, although it could be applied for longer. After the bias is removed and the cantilevers are taken away from the conducting substrate, the cantilevers are ready for lithography. This process can be repeated as necessary to replace any charge that leaks from the nitride layer.

This embodiment eliminates the need for a conductive path to the tip (see e.g., conductive path 201 in FIG. 12). Lithography is performed by causing the cantilever to which tip 150 is attached to bend away from the substrate 154, as described above, using the circuitry shown in FIG. 14A.

FIG. 14B shows a control circuit that is used to perform lithography by controlling the bias of the tip. Many of the components shown in FIG. 14B are the same as those shown in FIG. 14A and are similarly designated. In FIG. 14B, switch S1 is connected such that $V_1$ is applied to the bridge B1 when the switch is in one position and $V_2$ is applied to bridge B1 when the switch is in the other position. Switch S1 is ganged with a switch S4 and through a manually operated, opposite voltage switch S5 with switches S2 and S3. Opposite voltage switch S5 is closed when $V_1$ and $V_2$ have opposite signs and open when they have the same sign.

Switch S2 allows the output of amplifier A2 to be passed through an inverter I1 before it is delivered through resistor R4' to an input of error sum amplifier A3. Switch S3 allows the output of error sum amplifier A3 to be inverted before it is passed to an input of amplifier A4. Switch S4 allows the output of amplifier A1 to be passed through a resistor R9 to an input of error sum amplifier A3. The value of resistor R9 is set such that the following relationship holds:

$$\frac{R4}{R9} = \frac{V_1}{V_2}$$

The operation of this circuit will be described first in the situation where $V_1$ and $V_2$ have the same polarity (i.e., the opposite voltage switch S5 is open). In this condition, switches S2 and S3 are in the state shown in the drawing (i.e., inverters I1 and I2 are not operative). $V_2$ is set such that $V_2/4$, which is the voltage at the tip, exceeds whatever threshold voltage is required to cause lithography to be performed. Typically, lithography by oxidation takes place with the tip biased negatively with respect to the substrate whereas lithography by electron current may take place with the tip biased either positively or negatively with respect to the substrate, provided that the voltage difference between the tip and substrate exceeds (in absolute value terms) a particular threshold. $V_1$ is set such that $V_1/4$ is below the applicable threshold voltage.

When the switches S1 and S4 are in the position shown in FIG. 14B, the circuit operates exactly like the circuit of FIG. 14A in the imaging (non-lithographic) mode. When switch S1 is thrown to connect $V_2$ to the bridge circuit B1, the voltage at the tip exceeds the applicable threshold and lithography is performed. In this situation, switch S4 connects resistor R9 into the circuit between the output of amplifier A1 and the input of amplifier A3. Since, as described above, $$\frac{R_4}{R_9} = \frac{V_1}{V_2},$$

switching $R_9$ into the circuit compensates for the difference between $V_1$ and $V_2$ and ensures that the voltage at the input of amplifier A3 will remain constant. As a result, a consistent signal is delivered to terminals 319T and 327T, assuring that the piezoelectric element 325 receives the same input signal.

When $V_1$ and $V_2$ are of opposite polarity, the opposite voltage switch S5 is closed. With switch S5 closed, the $V_{ref}$ output of amplifier A2 is passed through inverter I1, and this adjusts for the change of polarity at the input of error sum amplifier A3. Similarly, the polarity of the output of amplifier A3 is corrected by passing it through inverter I2. Thus, switches S2 and S3 correct for the difference in polarity between $V_1$ and $V_2$. As described above, switch S4 corrects for the difference in the absolute values of $V_1$ and $V_2$. Again, switches S2, S3 and S4, together assure that the piezoelectric element 325 receives the same input regardless of the state of switch S1.

An array of cantilevers in accordance with this embodiment of the invention may also be operated in the "attractive" or non-contact mode. In this mode, a superimposed AC/DC signal is applied to the piezoelectric element 325, causing it to vibrate at a specified frequency. As described above, when the tip is brought very close to the surface, the actual frequency of vibration is dependent on the gradient of Van der Waals or other forces which exist between the tip and the substrate. The actual frequency of vibration is detected by the piezoresistor 309, and this is used to maintain a desired separation between the tip and the surface. The separation between the tip and the surface is adjusted by varying the DC component of the signal delivered to the piezoelectric element 325. Circuitry similar to that shown in FIGS. 14A and 14B is used to perform lithography with the cantilever.

It is also possible to operate the cantilever array in the contact mode without correcting for the bending of the individual cantilevers as a result of undulations in the surface of the substrate. In this embodiment, the piezoelectric element may be omitted or may be used only to control the actual lithography by lifting the cantilevers away from the surface of the substrate.

While specific embodiments according to this invention have been described above, it will be apparent from the foregoing that a wide variety of alternative embodiments could be designed and fabricated without departing from the broad principles of this invention. For example, in some applications a cantilever used as a near field scanning optical microscope, as described in U.S. Pat. No. 5,354,985, or used as an atomic force microscope, may be included in an array of lithographic cantilevers as described herein. Accordingly, it is intended that the invention, as defined in the following claims, cover all such embodiments.

We claim:

1. A method of performing lithography on a substrate using a layer of resist, said method comprising the following steps:

providing an array of cantilevers, said cantilevers being formed in a first substrate, each of said cantilevers including a tip located near a free end of said cantilever and a conductive path extending to said tip;

providing a second substrate, said second substrate being coated with a layer of resist;

bringing said first and second substrates together such that said tips of said cantilevers are adjacent a surface of said layer of resist;

scanning said cantilevers above said surface, said step of scanning comprising the step of causing one of said first and second substrates to oscillate back and forth along a first axis while causing the other of said first and second substrates to advance along a second axis generally perpendicular to said first axis; and causing an electric current to flow between said tips and said layer of resist and then interrupting said electric current whereby said layer of resist is exposed in a plurality of selected lithographic patterns by said electric current.

2. The method of claim 1 wherein said layer of resist comprises a material selected from the group consisting of self-assembled monolayers, multilayered surface imaging resists, and poly(methylmethacrylate).

3. The method of claim 1 wherein said tips are in contact with said surface during said scanning.

4. The method of claim 1 wherein said tips are not in contact with said surface during said scanning.

5. The method of claim 4 further comprising the steps of:

causing said cantilevers to vibrate; and detecting the respective frequencies at which said cantilevers are vibrating.

6. The method of claim 5 wherein the step of causing said cantilevers to vibrate includes the step of applying an AC signal to a piezoelectric element attached to each of said cantilevers.

7. The method of claim 5 further comprising the step of using the detected frequency of vibration of each cantilever to adjust a separation between said tip of said cantilever and said surface of said layer of resist.

8. The method of claim 7 wherein the steps of causing said cantilever to vibrate and adjusting said separation include the step of applying a superimposed AC/DC signal to a piezoelectric element attached to said cantilever.

9. The method of claim 1 wherein the step of interrupting said electric current comprises causing said cantilever to bend in a direction away from said surface of said layer of resist.

10. The method of claim 1 wherein the step of interrupting said electric current comprises opening a switch that is connected in an electric conduction path extending to said tip.

11. The method of claim 1 wherein said step of scanning comprises oscillating said first substrate along said first axis and advancing said second substrate along said second axis.

12. The method of claim 1 wherein said step of scanning comprises oscillating said second substrate along said first axis and advancing said first substrate along said second axis.

13. The method of claim 1 wherein a piezoelectric element is used to cause said one of said substrates to oscillate along said first axis.

14. The method of claim 1 wherein a piezoelectric element is used to cause said one of said substrates to advance along said second axis.

15. The method of claim 1 wherein the other of said first and second substrates is advanced along said second axis in steps such that each of said tips describes a raster pattern on said second substrate.

16. A method of performing lithography on a substrate, said method comprising the steps of:

providing an array of cantilevers, said cantilevers being formed in a first substrate, each of said cantilevers including a tip located near a free end of said cantilever and a conductive path extending to said tip;

providing a second substrate;

bringing said first and second substrates together such that said tips of said cantilevers are adjacent a surface of said second substrate;

scanning said cantilevers above said surface, said step of scanning comprising the step of causing one of said first and second substrates to oscillate back and forth along a first axis while causing the other of said first and second substrates to advance along a second axis generally perpendicular to said first axis; and electrically biasing each of said tips so as to create an electric field between said tip and said second substrate and then interrupting said electric field whereby said electric field causes an oxide layer to form in a plurality of selected lithographic patterns on said second substrate.

17. The method of claim 16 wherein said second substrate comprises a material selected from the group consisting of silicon, silicon dioxide, aluminum, chromium and titanium.

18. The method of claim 16 wherein said tips are in contact with said surface during said scanning.

19. The method of claim 16 wherein said tips are not in contact with said surface during said scanning.

20. The method of claim 19 further comprising the steps of:

causing said cantilevers to vibrate; and detecting the respective frequencies at which said cantilevers are vibrating.

21. The method of claim 20 wherein the step of causing said cantilevers to vibrate includes the step of applying an AC signal to a piezoelectric element attached to each of said cantilevers.

22. The method of claim 20 further comprising the step of using the detected frequency of vibration of each cantilever to adjust a separation between said tip of said cantilever and said surface of said substrate.

23. The method of claim 22 wherein the steps of causing said cantilever to vibrate and adjusting said separation include the step of applying a superimposed AC/DC signal to a piezoelectric element attached to said cantilever.

24. The method of claim 16 wherein the step of interrupting said electric current comprises causing said cantilever to bend in a direction away from said surface of said substrate.

25. The method of claim 16 wherein the step of interrupting said electric current comprises opening a switch that is connected in an electric conduction path extending to said tip.

26. The method of claim 16 wherein said step of scanning comprises oscillating said first substrate along said first axis and advancing said second substrate along said second axis.

27. The method of claim 16 wherein said step of scanning comprises oscillating said second substrate along said first axis and advancing said first substrate along said second axis.

28. The method of claim 16 wherein a piezoelectric element is used to cause said one of said substrates to oscillate along said first axis.

29. The method of claim 16 wherein a piezoelectric element is used to cause said one of said substrates to advance along said second axis.

30. The method of claim 16 wherein the other of said first and second substrates is advanced along said second axis in steps such that each of said tips describes a raster pattern on said second substrate.

31. A method of performing lithography on a substrate, said method comprising the steps of:

providing an array of cantilevers, said cantilevers being formed in a first substrate, each of said cantilevers including a tip located near a free end of said cantilever and a conductive path extending to said tip;

providing a second substrate, said second substrate including a surface layer of a material that is softer than a material at a surface of said tip;

bringing said first and second substrates together such that said tips of said cantilevers are adjacent said surface layer;

scanning said cantilevers across said surface, said step of scanning comprising the step of causing one of said first and second substrates to oscillate back and forth along a first axis while causing the other of said first and second substrates to advance along a second axis generally perpendicular to said first axis; and causing each of said cantilevers to bend in a direction toward said substrate such that said tip of said cantilever scribes a trench in said surface layer.

32. The method of claim 31 wherein the other of said first and second substrates is advanced along said second axis in steps such that each of said tips describes a raster pattern on said second substrate.

* * * * *